US009023978B2

(12) United States Patent
Holmes et al.

(10) Patent No.: US 9,023,978 B2
(45) Date of Patent: May 5, 2015

(54) SOLUTION-PROCESSABLE PHOSPHORESCENT MATERIALS

(75) Inventors: Andrew Bruce Holmes, Parkville (AU); Albertus Sandee, Utrecht (NL); Charlotte Williams, London (GB); Annette Koehler, Potsdam (DE); Nick Evans, Wellington (NZ)

(73) Assignee: Cambridge Enterprise Ltd., Cambridge (GB)

( * ) Notice: Subject to any disclaimer, the term of this patent is extended or adjusted under 35 U.S.C. 154(b) by 1575 days.

(21) Appl. No.: 10/511,954

(22) PCT Filed: Apr. 24, 2003

(86) PCT No.: PCT/GB03/01765
§ 371 (c)(1),
(2), (4) Date: Jul. 11, 2005

(87) PCT Pub. No.: WO03/091355
PCT Pub. Date: Nov. 6, 2003

(65) Prior Publication Data
US 2006/0063026 A1    Mar. 23, 2006

(30) Foreign Application Priority Data
Apr. 26, 2002  (GB) .................................. 0209652.7

(51) Int. Cl.
C08G 85/00  (2006.01)
C09K 11/06  (2006.01)
H05B 33/14  (2006.01)
C08G 61/02  (2006.01)
H01L 51/00  (2006.01)
H01L 51/50  (2006.01)

(52) U.S. Cl.
CPC ............... *H05B 33/14* (2013.01); *C08G 61/02* (2013.01); *C09K 11/06* (2013.01); *C09K 2211/1416* (2013.01); *C09K 2211/1425* (2013.01); *C09K 2211/1433* (2013.01); *C09K 2211/145* (2013.01); *C09K 2211/1458* (2013.01); *C09K 2211/1466* (2013.01); *C09K 2211/1483* (2013.01); *C09K 2211/185* (2013.01); *H01L 51/0039* (2013.01); *H01L 51/0043* (2013.01); *H01L 51/0085* (2013.01); *H01L 51/5016* (2013.01)

(58) Field of Classification Search
None
See application file for complete search history.

(56) References Cited

U.S. PATENT DOCUMENTS

| 5,442,021 | A | 8/1995 | Heiliger ........................ 526/241 |
|---|---|---|---|
| 6,869,693 | B2 | 3/2005 | Fryd et al. | |
| 7,238,435 | B2 | 7/2007 | Kamatani et al. ............. 428/690 |
| 7,250,226 | B2 | 7/2007 | Tokito et al. ................... 428/690 |
| 7,250,512 | B2 | 7/2007 | Lecloux et al. ..................... 546/4 |
| 7,947,340 | B2 * | 5/2011 | Ikehira et al. .................. 428/1.1 |
| 2001/0019782 | A1 | 9/2001 | Igarashi et al. ............... 428/690 |
| 2002/0028349 | A1 | 3/2002 | Seo ................. 428/690 |
| 2002/0079830 | A1 * | 6/2002 | Brunner et al. ............... 313/498 |
| 2002/0193532 | A1 * | 12/2002 | Ikehira et al. .............. 525/333.3 |
| 2003/0091862 | A1 | 5/2003 | Tokito et al. | |
| 2003/0186080 | A1 | 10/2003 | Kamatani et al. ............. 428/690 |
| 2003/0224208 | A1 | 12/2003 | Kamatani et al. ............. 428/690 |
| 2004/0133004 | A1 | 7/2004 | Stossel et al. ...................... 546/2 |
| 2004/0138455 | A1 | 7/2004 | Stossel et al. ...................... 546/2 |
| 2005/0196639 | A1 | 9/2005 | Kamatani et al. ............. 428/690 |
| 2007/0257604 | A1 | 11/2007 | Kamatani et al. ............. 313/504 |
| 2007/0292718 | A1 | 12/2007 | Lecloux et al. ............... 428/691 |

FOREIGN PATENT DOCUMENTS

| EP | 1 138 746 A1 | 10/2001 |
|---|---|---|
| EP | 1 245 659 A1 | 10/2002 |
| JP | 2001-342459 | 12/2001 |
| JP | 2003-073479 | 3/2003 |
| JP | 2003-171659 A | 6/2003 |
| JP | 2003-342325 A | 12/2003 |
| JP | 2004-531850 A | 10/2004 |
| JP | 2005-508437 | 3/2005 |
| JP | 2007-059939 | 3/2007 |
| JP | 2007-277558 | 10/2007 |
| JP | 2008-019443 | 1/2008 |
| WO | WO 02/31896 A2 | 4/2002 |
| WO | WO 02/066552 | 8/2002 |
| WO | WO 02/068435 | 9/2002 |
| WO | WO 02/081488 | 10/2002 |
| WO | WO 03/001615 | 1/2003 |
| WO | WO 03/001616 A2 | 1/2003 |
| WO | WO 03/001616 A3 | 1/2003 |
| WO | WO 03/018653 A1 | 3/2003 |
| WO | WO 03/040256 | 5/2003 |

OTHER PUBLICATIONS

Ley et al., "Photophysics of metal-organic π-conjugated polymers," *Coordination Chemistry Review*, 171:287-307 (1998).
Lee et al., "Electrophosphorescent Light Emitting Devices Using Mixed Ligand Ir(III) Complexes", *Mat. Res. Soc. Symp. Proc.*, 708:119-123 (2002).
"Quinoxaline-Based Conjugated Polymers containing Ruthenium(II) Bipyridine Metal Complex", Ng et al., Macromol. Rapid Commum. 18, 1997, pp. 1009-1016.
"Yellow Light-Emitting Poly(phenylenevinylene) Incorporated with Pendant Ruthenium Bipyridine and Terpyridine Complexes", Wong et al., Advanced Materials 11, No. 6, 1999, pp. 455-459.

(Continued)

*Primary Examiner* — Marie R. Yamnitzky
(74) *Attorney, Agent, or Firm* — Marshall, Gerstein & Borun LLP

(57) ABSTRACT

A material capable of luminescence comprising a polymer or oligomer and an organometallic group, wherein the polymer or oligomer is at least partially conjugated and the organometallic group is covalently bound to the polymer or oligomer and at least one of the nature, location, and proportion of the polymer or oligomer and of the organometallic group in the material are selected so that the luminescence predominantly is phosphorescence.

8 Claims, 13 Drawing Sheets

(56) References Cited

OTHER PUBLICATIONS

"Synthesis and Electronic Properties of New Photoluminescent Platinum-Containing Polyynes with 9,9-Dihexylfluorene and 9-Butylcarbazole Units", Macromolecules 35, 2002, pp. 3506-3513, Wong et al.

International Search Report in PCT/GB03/01765 dated Dec. 5, 2003.
Partial English translation of Office Action for corresponding Japanese Patent Application No. 2012-152133, dated Dec. 10, 2013.
Office Action for corresponding Japanese Patent Application No. JP 2003-587896, dated Jun. 1, 2010 (English translation).

* cited by examiner

<Scheme 1>

< Scheme 2>

<Scheme 3>

<Scheme 4>

SOLUTION-PROCESSABLE PHOSPHORESCENT MATERIALS

This is the U.S. national phase of International Application No. PCT/GB03/01765 filed Apr. 24, 2003, the entire disclosure of which is incorporated herein by reference.

The present invention relates to novel materials that are capable of luminescence; to a method of making the novel materials and to uses of the novel materials.

Luminescent conjugated polymers are a new technologically important class of materials that will be used in light emitting display devices for the next generation of information technology based consumer products. The principle interest in the use of polymers, as opposed to inorganic semiconducting and organic dye materials, lies in the scope for low-cost manufacturing, using solution-processing of film-forming materials. Since the last decade much effort has been devoted to the improvement of the emission efficiency of organic light emitting diodes (OLEDs) either by developing highly efficient materials or efficient device structures.

In OLEDs, electrons and holes are injected from opposite electrodes and are combined to form two types of excitons; spin-symmetric triplets and spin-antisymmetric singlets in a theoretical ratio of 3:1. Radiative decay from the singlets is fast (fluorescence), but from the triplets (phosphorescence) it is formally forbidden by the requirement of the spin conservation.

Initially spurred on by this understanding that the maximum internal quantum efficiency of an OLED was limited to 25% the idea of transferring both singlets and triplets to a phosphorescent dopant was conceived. Such a phosphor ideally is able to accept both singlet and triplet excitons from the organic material and generate luminescence, particularly electroluminescence from both.

This idea is still highly applicable even given recent studies questioning the 3:1 triplet to singlet ratio predicted by the spin-independent recombination model. Recent studies suggest that the proportion of triplet excitons generated in small molecule devices is indeed close to 75%, (Baldo, M. A.; O'Brien, D. F.; Thompson, M. E.; Forrest, S. R. Phys. Rev. B 1999, 60, 14422) whereas in an electrically excited conjugated polymer it is suggested to be around 50%, (Cao, Y.; Parker, I. D.; Yu, G.; Zhang, C.; Heeger, A. J. Nature 1999, 397, 414 and Wilson, J. S.; Dhoot, A. S.; Seeley, A. J. A. B.; Khan, M. S.; Köhler, A.; Friend, R. H. Nature 2001, 413, 828). Evidence for the copious generation of triplet excitons in polymer LEDs has been obtained by magnetic and optical observations.

In the past few years many have studied the incorporation by blending of phosphorescent materials into a semiconductive layer. Good results have been achieved for OLED's based on blends incorporating a phosphorescent dopant and a small molecule or a non-conjugated polymer host such as polyvinylcarbazole. Conjugated polymers have also been disclosed as hosts, for example a blend of $Eu(dnm)_3phen$ in CN-PPP with a quantum efficiency of 1.1%. [Adv. Mater., 1999, 11, 1349.]. Similarly, Phys. Rev. B 2001, 63, 235206 discloses poly(9,9-dioctylfluorene) doped with 2,3,7,8,12,13,17,18-octaethyl-21H,23H-porphyrin platinum (II).

One of the reasons for the lack of success with polymers is that blends of polymers are sensitive to the concentration of the triplet harvester guest in the polymer host. Therefore even at relatively low concentrations the guest can phase separate leading to morphology changes such as aggregation and problems with light scattering, electrochemical breakdown and luminescence quenching. Aggregation leads to triplet quenching (by bimolecular anniliation processes) and also reduces the efficiency of exciton transfer, because the transfer happens mostly at the polymer/guest interface, and guest molecules inside a phase or aggreate cannot be reached.

In view of the aforementioned problems, predictions for achieving good efficiency with phosphorescent, particularly electrophosphorescent, polymer OLEDs have been pessimistic. As such, the art has focused on achieving optimal singlet emission (fluorescence) from polymer OLEDs.

In this regard, it is to be noted that luminescent polymers containing metal complexes are known in this art. However, in keeping with the above, these materials act predominantly as fluorescent materials and not phosphorescent materials. An example of such a material is given in Macromol. Rapid. Commun. 18, 1009-1016 (1997.

Macromolecules 2002, 35, 3506-3513 discloses platinum (II) polyyne polymers $[—Pt(PBu_3)_2C{\equiv}CRC{\equiv}C—]_n$. In these materials it can be seen that the organometallic group is not bound to a polymer or oligomer.

Chem. commmun. 2002, 784-785 discloses amorphous iridium complexes for electrophosphorescent light emitting devices. These complexes do not comprise a polymer or oligomer to which the organometallic group is bound.

Advanced Materials 1999, 11, No. 6, page 455-459 discloses a series of PPVs which contain pendant tris(2,2'-bipyridyl)ruthenium(II). These materials are not capable of luminescence that is predominantly phosphorescence.

WO02/31896 discloses a polymeric metal complex. The polymers specified in this document are not conjugated.

In view of the above, it will be appreciated that there still remains a need to provide polymer OLEDs having good efficiency.

Accordingly, it is an aim of the present invention to at least partially address this need by providing a new emissive material for use in an OLED.

It is a further aim of the present invention to provide methods for making the new emissive material.

It is still a further aim of the present invention to provide uses for the new emissive material.

Accordingly, the present invention provides a material capable of luminescence comprising a polymer or oligomer; and an organometallic characterised in that the organometallic is covalently bound to the polymer or oligomer and the nature, location and/or proportion of the polymer or oligomer and of the organometallic in the material are selected so that the luminescence predominantly is phosphorescence.

The present inventors have addressed the aforementioned need for polymer OLEDs having good efficiency by providing a new material that is capable predominantly of phosphorescence, preferably electrophosphoresence. In the present invention, by "phosphorescence" is meant luminescence by radiative decay from a triplet energy level.

The present inventors have addressed at least partially the aforementioned need by harvesting previously wasted triplet excitons. This is completely opposed to the currently favoured work concentrating on optimising harvest of singlet excitons from polymers.

The present material generally is superior to a polymer blend incorporating a phosphorescent dopant. This is because problems relating to morphology changes such as aggregation and phase separation are avoided with the present material. The controlled structure of the present material means that the location and mobility of the oganometallic in the material is spatially controlled. This spatial control enables control of the interaction between the polymer or oligomer and the organometallic. This, in turn, enables manipulation, particularly to some extent of the energy levels of the material in its excited state when the organometallic is conjugatively linked to the polymer or oligomer because of synergistic effects between the polymer or oligomer and the organometallic.

The present materials are advantageous in that they give bright phosphorescence in solution-processed devices. Also, recent reports suggesting the triplet states of conjugated polymers such as poly(3-alkylthiophene) [Macromol., 1993, 26, 2954.] and PPV derivatives [Chem. Mater., 1999, 11, 1302.] can sensitise the generation of singlet oxygen, which can degrade the polymer.

Also, advantageously, the present material usually is homogenous and solution-processable.

The nature, location and/or proportion or the polymer or oligomer and of the organometallic in the material is selected so that the luminescence predominantly is phosphorescence. Preferably, greater than 70% of the luminescence is phosphorescence, even more preferably, greater than 90% of the luminescence is phosphorescence. Most preferably, 95 to 100% of the luminescence is phosphorescence.

Usually the organometallic group will include a carbon-metal bond. However this is not essential in the present invention.

The and nature, location and/or proportion of the polymer or oligomer and of the organometallic in the material should be selected so that the energy levels of the polymer or oligomer and organometallic are complimentary to one another. This will allow the transfer of both singlets and triplets from the polymer or oligomer in its excited state to the organometallic. Theoretically, 100% transfer of both singlets and triplets from the polymer or oligomer can be achieved. Predominantly phosphorescent emission then will occur. In order for this to occur, generally but not essentially, the singlet and triplet energy levels of the organometallic should be lower than the corresponding singlet and triplet energy level of the polymer or oligomer. (Adachi et al. Appl. Phys. Lett., 2001, 79, 2082).

When the organometallic is conjugatively linked to the polymer or oligomer, this may lead to mixing of the energy levels. This mixing of energy levels is particularly advantageous because conjugation of a ligand having a high triplet energy level (T1) to a polymer or oligomer having a lower T1 level produces an intermediate T1 level that can allow energy to transfer from the polymer or oligomer to the ligand. In contrast, poor performance is reported for a mixture of a polymeric host with a phosphorescent dopant wherein the host has a lower T1 level than the dopant [Appl. Phys. Lett. 2003, 82(7), 1006]. Charge transport from the polymer or oligomer to the organometallic group may also be enhanced in polymers according to the invention as compared to prior art blends of organometallic compounds and polymers.

Mixing of the triplet energy levels also may be useful for controlling the colour of phosphorescent emission. This mixing involves the formation of an intermediate energy level that is between the T1 level of the polymer or oligomer and the T1 level of the organometallic group. In particular, the nature of the polymer or oligomer and the conjugation length of the polymer or oligomer can be used to control the colour of phosphorescent emission. For example, one or more fluorene repeat units in the polymer or oligomer can be used to red shift the emission of an organometallic comprising a phenyl pyridine ligand.

Generally, an increase in the extent of conjugation in a material can be said to lower the triplet energy level of that material. As such, controlling the extent of conjugation in the present material can be a useful method of controlling at least partially the triplet energy levels. In this regard, in one embodiment, it is preferred that that the backbone of the polymer or oligomer is partially conjugated, more preferably substantially or even fully conjugated in order to control to some extent the triplet energy level of the polymer or oligomer.

In order to increase conjugation of the polymer or oligomer, it is preferred that the polymer or oligomer comprises an aryl or heteroaryl repeat unit, for example a fluorene or phenyl group, such as a phenylene vinylene group. Thus, in one embodiment, the present material preferably comprises a polyfluorene or polyphenylene, most preferably a polyfluorene homopolymer/oligomer or higher order polymer/oligomer such as a copolymer/oligomer.

In one embodiment the polymer or oligomer backbone is not a homo polyfluorene or a homo polyphenylene;

In another embodiment, where the polymer or oligomer backbone comprises the group:

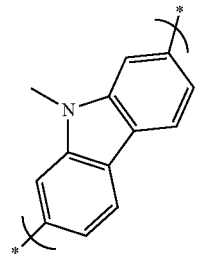 [SMILES: *c1ccc2c3ccc(*)cc3n(C)c2c1]

this group must be linked in the backbone as shown above by *.

In another embodiment still, it is preferred that the polymer or oligomer is not a homopolymer or homo-oligomer. A co- or ter-, polymer or oligomer is preferred in this embodiment.

Preferred aryl or heteroaryl repeat units comprise a group selected from the group consisting of 2,7-linked 9,9 disubstituted fluorene, a p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene or a triarylamine.

Any polymer or oligomer can be used so long as its energy levels are complimentary to the organometallic so that the material is capable predominantly of phosphorescence, preferably electrophosphorescence. To this end, in one embodiment, the present inventors have found that the polymer or oligomer preferably is conducting or semiconducting and, more preferably, semiconducting. In this embodiment, preferably, the polymer or oligomer is capable predominantly of fluorescence (i.e. singlet emission), preferably electrofluorescence, in the absence of the organometallic.

It may be preferable in some embodiments for the polymer or oligomer to include solubilising groups in order to improve the solubility of the material. Preferred solubilising groups include alkyl and alkoxy groups. In this regard, it is preferred that the material is solution-processable.

Usually, the organometallic will be neutral to avoid charge trapping; very stable; and preferably conducting. Importantly the organometallic should be a predominantly triplet emitting material at room temperature.

The organometallic will be covalently bonded to the polymer or oligomer in the material. Further, it is preferred that the organometallic is conjugatively bonded to the polymer or oligomer.

Preferably, the organometallic includes a transition metal or lanthanides. The transition metal preferably is a precious metal, more preferably iridium, rhodium, renium, osmium or platinum. It is to be noted that the mechanism for energy transfer will be different where the organometallic is a precious metal as compared with the lanthanide. This difference in mechanism is not important in the present invention so long as the material is capable predominantly of phosphorescence, preferably electrophosphorescence.

It is suggested that any previously known organometallic "phosphor" or a derivative thereof is a good candidate for use as the organometallic in the present invention. In this regard, Platinum, Iridium and Europium complexes are of considerable interest in the present invention.

The nature of the ligands in the organometallic may be selected in order to optimise further compatibility of the organometallic with the polymers or oligomer. To this end, ligands suitably may be selected from the categories: 1) Electron Transport Materials, 2) Hole Transport Materials and 3) (Semi)conducting Materials. In selecting ligands, account should be taken of possible steric hindrance. Typically, materials in these categories are preferably conjugated and more preferably comprise a conjugated bidentate ligand. Also preferably the ligand comprises at least one nitrogen atom for coordination with the metal.

Suitably the electron transport Material, hole transport material or (semi)conducting material may comprise a group selected from the group consisting of 2,7-linked 9,9 disubstituted fluorene, a p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene or a triarylamine.

Typically, the present material will contain more than one organometallic. In this case, spatial separation of the organometallics in the material becomes more important. Spatial separation may be controlled by the method of manufacture as described in more detail below or by selecting the organometallic to be pendant from the backbone of the polymer or oligomer. In this regard, the material may have a structure as shown in general formula I below:

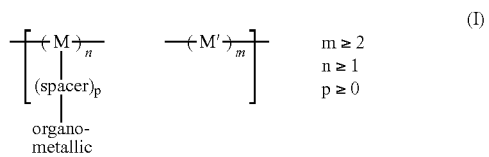

where M and M' each independently comprise an aryl or heteroaryl group.

With a view to further controlling the properties of the material, the spacer group may be used to interrupt conjugation in the material. Accordingly, in one embodiment there is provided a non-conjugated spacer group such as an optionally substituted C1-C10 alkylene group. Alkylene groups are useful for controlling the distance between the polymer or oligomer and the organometallic, thus improving charge trapping. In this regard alkyl groups and alkyl-ether groups are suitable spacer groups. In one embodiment, preferably the spacer group does not comprise a phenylene group or —C≡C—.

The length of the spacer group also can be used to control to some extent the separation of the organometallic from the polymer or oligomer backbone. As such, the spacer group suitably may be a chain of $CH_2$ groups.

In a preferred material of general formula I, M and M' may be the same or different and each independently comprises a group selected from the group consisting of 2,7-linked 9,9 disubstituted fluorene, a p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene or a triaryl amine.

It will be understood that in general formula I, M and M' will be joined to form the backbone of the polymer or oligomer. In this regard, the polymer or oligomer may be a seeded/block or random polymer or oligomer as desired.

One example of a material having general formula I is shown below:

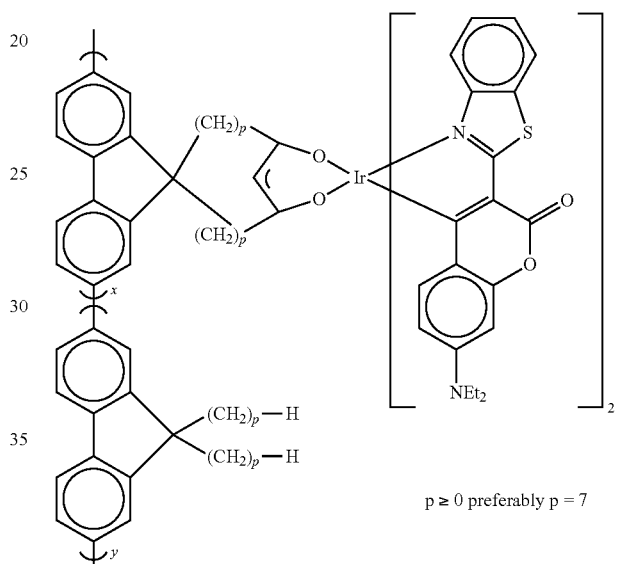

It should be understood that, in general formula I, if it is desirable, one or more additional, preferably aryl or heteroaryl, repeat units that are different to those shown in general formula I may be included in the backbone of the polymer or oligomer.

Where the organometallic is not pendent from the polymer or oligomer backbone, the material may have a structure as shown in general formula II or general formula III below:

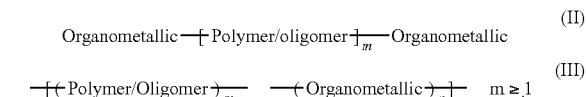

In the materials shown in general formulas II and III, the spatial separation of the organometallics in the material is controlled principally by the method of manufacture.

In general formula III, the polymer/oligomer units and the organometallic units may be linked as desired so that the material is capable predominantly of phosphorescence, preferably electrophosphorescence. One example is shown below:

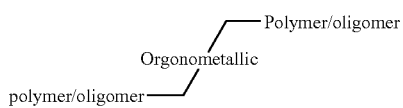

A suitable organometallic for use in the above material is:

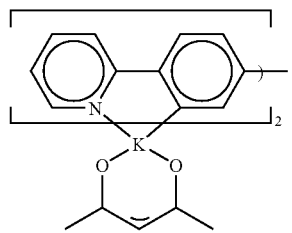

In the above, K is a metal, preferably a precious metal, more preferably Ir.

In the context of the present invention, the organometallic may be considered as a metal surrounded by an appropriate number of ligands. Usually, in general formulas II and III, the organometallic will be joined to the backbone of the polymer or oligomer through one of its ligands. However, there may be a preferred embodiment where the organometallic is joined to the backbone of the polymer or oligomer through two of its ligands.

Ligands around the metal may be the same or different. In this regard, the organometallic repeat unit in the material shown in general formulas II and III may have the structure:

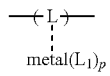

where L is a ligand, preferably a bidentate ligand. The L and $L_1$ ligands may the same or different from one another. In one embodiment it is preferred that L is not the same as the $L_1$ ligand (or at least one of the $L_1$ ligands, where more than one $L_1$ ligand is present).

Further ligands $L_1$ (which may the same or different from one another) are incorporated to satisfy the valency of the metal. In this regard, $L_1$ can be a bidentate or monodentate ligand and p is chosen accordingly. In one aspect, preferred $L_1$ groups include cyclometalating, beta-diketonates. In another aspect, L and $L_1$ may be selected such that L has a higher $T_1$ level than $L_1$. Energy is thereby transferred from L to $L_1$ in order to obtain emission from $L_1$. For example, L may be phenylpyridine and $L_1$ may be 2-(2-pyridyl)-benzo(b)thiophene (btp).

It will be appreciated that a monomer from which the repeat unit shown above may derive may have two reactive end groups directly bound to L.

Cyclometalated, precious metal complexes such as iridium, rhodium and platinum complexes are particularly preferred, for example chelate complexes such as platinum polyynes, platinum-porphyrins and iridium tris(phenylpyridine), bis(phenyl isoquinoline) iridium acetylacetonate platinum (II) (2-2'-(4',5'benzo)thienyl)pyridinato-N,C3')) acetylacetonate.

The relative proportions of polymer/oligomer and organometallic in the present material must be selected so that the material is capable predominantly of phosphorescence, preferably electrophosphorescence. In this regard, too high a level of organometallic may lead to quenching of the phosphorescence. Alternatively, too low a proportion of organometallic will not receive all of the energy from the polymer or oligomer. Generally, it is preferred that the organometallic is present in the material in an amount in the range of from 0.5 to 70% by weight, more preferably from 1 to 10% by weight.

In one embodiment, desirably the present material does not have a formula as shown below in any of the following four formulae:

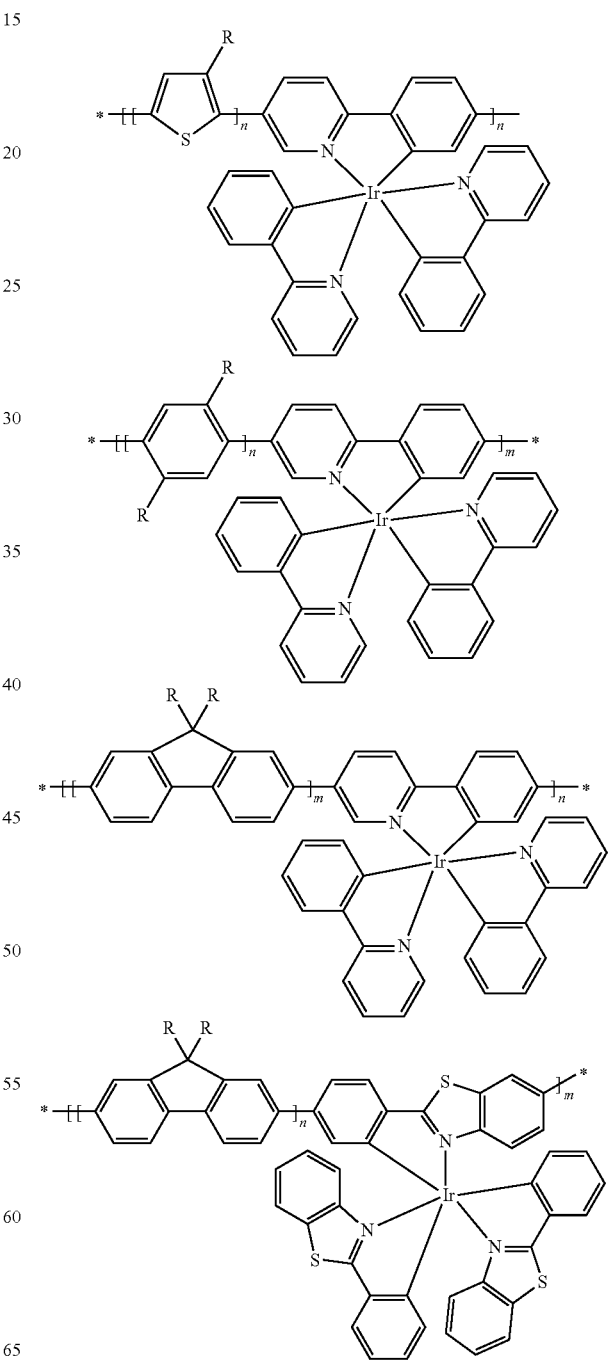

The present materials are extremely useful in OLED's, particularly, for large-area devices like matrix displays. Also, the present materials are of use in electrically pumped organic lasers.

The present materials advantageously can be prepared by the well-known Suzuki polymerisation. In overview, this method involves polymerising monomers having at least two reactive groups selected from boronic acid, boronic acid ester (preferably C1-C6)), borane (preferably C1-C6) with dihalide functional monomers or monomers having one reactive boronic acid, boronic acid ester (preferably C1-C6)), borane (preferably C1-C6) group and one reactive halide functional group with each other in a reaction mixture in the presence of a catalyst. This method is described in U.S. Pat. No. 5,777,070 and a derivative thereof is described in WO 00/53656. Alternatively, polymers according to the invention can be prepared by Yamamoto polymerisation as disclosed in "Macromolecules", 31, 1099-1103 (1998) wherein all monomers are provided with reactive halide groups. The contents of these documents are incorporated herein by reference.

In this regard, a first embodiment of a second aspect of the present invention provides a process for preparing a material as defined in the first aspect of the present invention which comprises:

(a) reacting monomers to form a polymer or oligomer wherein each monomer has at least two reactive groups selected from the group consisting of a halide group, a boronic acid group, a boronic ester group and a borane group and each monomer comprises an aryl or heteroaryl group; and (b) terminating the polymer or oligomer formed in step (a) using an end-capping reagent, said end-capping reagent comprising one reactive group selected from the group consisting of a halide group, a boronic acid group, a boronic ester group and a borane group and either (i) containing an organometallic as defined above or (ii) being capable of forming a complex with a metal when treated with a meal complexing reagent; and (c) where the end-capping reagent is as defined in (ii), treating the terminated polymer or oligomer with a metal-complexing reagent.

The treatment in step (c) of the polymer or oligomer formed in step (b)(ii) above may be considered to be as shown in scheme VII:

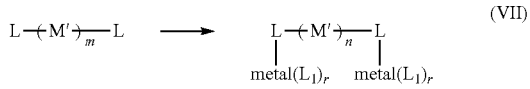

(VII)

where L, M', m, L' and r are as defined above.

In a second embodiment of the second aspect of the present invention, there is provided a process for preparing a material as defined in the first aspect of the present invention which includes reacting at least one first monomer with a plurality of second monomers which are different to the first monomer to form a polymer or oligomer;

wherein each monomer comprises an aryl or heteroaryl group and has at least two reactive groups selected from the group consisting of a halide group, a boronic acid group, a boronic ester group and a borane group; and wherein the first monomer either (i) contains an organometallic as defined above or (ii) is capable of forming a complex with a metal when treated with a metal complexing reagent; and (c) where the first monomer is as defined in (ii), treating the polymer or oligomer with a metal-complexing reagent.

In either the first or second embodiment, suitable reactive halide groups include bromine, chlorine and iodine. A preferred reactive halide group is bromine.

In one aspect it is preferred that at least one of X and X' is a reactive groups selected from the group consisting of a boronic acid group, a boronic ester group and a borane group, most preferably at least one of X and X' is a boronic acid group.

The treatment in step (c) of the polymer or oligomer formed in step (b)(ii) may be considered to be as shown in scheme VIII:

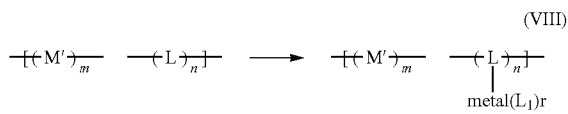

(VIII)

where L, M', m, n, L, $L_1$ and r are as defined above.

It will be clear from the above methods that, broadly speaking, the organometallic ultimately can be included in the present material as part of an end-capping group or as part of a monomeric residue. Within these two classes of method, the organometallic may be present in the end-capping reagent or monomer when first added to the reaction mixture. Alternatively, it may be introduced in a subsequent step after the terminated polymer or oligomer has been formed. The appropriate method may be selected according to the desirable nature, location and proportion of the polymer or oligomer and the organometallic in the material.

The methods according to the second aspect of the present invention enable manufacture of polymers having general formulas I, II and III.

In some embodiments of the second aspect of the present invention, it has been found that ligands sometimes inadvertently are removed from the metal during the reaction. Accordingly, it may be preferable to include a further step in these methods of restoring any removed ligands to the metal. In particular, polymers according to the invention wherein the starting organometallic group comprises one or more diketonates, such as acetylacetonate, are preferably treated with the diketone in the presence of a base following polymerisation of the organometallic group.

Surprisingly, the metal itself is not detached from L during the Suzuki reaction.

In the first embodiment of the second aspect of the present invention, it is preferred that the end capping reagent has a formula as shown in general formula X, XI or XII.

(X)

(XI)

(XII)

where X=reactive group as defined above, L is a ligand capable of forming a complex with a metal when treated with a metal-complexing reagent.

Where X is a reactive halide group in formula XI, X is bound to a ligand of the organometallic. In this regard, X is not bound to the metal in the organometallic.

Suitable reactive halide groups include bromine, chlorine and iodine. A preferred reactive halide group is bromine.

In one aspect it is preferred that X is a reactive group selected from the group consisting of a boronic acid group, a boronic ester group and a borane group, most preferably X is a boronic acid group.

In the second embodiment of the second aspect of the present invention, it is preferred that the first monomer has a general formula as shown in formula IV, V or VI

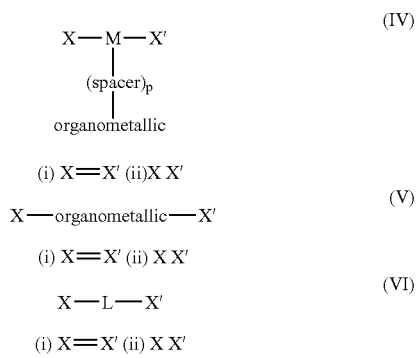

where the organometallic in formula V includes a carbon-metal bond; X and X' each is a reactive groups independently selected from the group consisting of a halide group, a boronic acid group, a boronic ester group and a borane group and L is a ligand capable of forming a complex with a metal when treated with a metal-complexing reagent; p≥o; and M is a group comprising an aryl or heteroaryl group.

Suitable reactive halide groups include bromine, chlorine and iodine. A preferred reactive halide group is bromine.

In one aspect it is preferred that at least one of X and X' in formulae IV, V and VI is a reactive groups selected from the group consisting of a boronic acid group, a boronic ester group and a borane group, most preferably at least one of X and X' is a boronic acid group.

In formula IV, in one embodiment, it is preferred that the organometallic includes a carbon-metal bond.

In formula V, X and X' preferably are directly bound to carbon atom, particularly where X and X' both are a reactive halide group.

Further, in formula V, X and X' preferably are directly bound to an aromatic group, where the aromatic group itself is directly bound to a metal. In this regard, it is further preferable that the aromatic group is a single aryl ring.

In formula V, in one embodiment, X and X' are bound to the same ligand in the organometallic.

In formulae IV and V, where X and/or X' is bound to a phenyl ring, preferably X and/or X' is not bound para to the metal in the organometallic. More preferably, X and/or X' is bound meta to the metal in the organometallic.

Preferably, M is a group selected from the group consisting of 2,7-linked 9,9 disubstituted fluorene, a p-linked dialkyl phenylene, a p-linked disubstituted phenylene, a phenylene vinylene, a 2,5-linked benzothiadiazole, a 2,5-linked substituted benzothiadiazole, a 2,5-linked disubstituted benzothiadiazole, a 2,5-linked substituted or unsubstituted thiophene or a triarylamine.

Preferably, the first monomer has only two reactive groups to achieve a linear polymer. However, some cross-linking may be achieved by having more than two reactive groups.

In order to control further the structure of the present material, the nature of the reactive groups can be selected so as to control the ordering of the monomers. In one embodiment, each monomer independently can be selected to contain either (a) two reactive halide groups; or (b) two reactive boron derivate groups independently selected from a boronic acid group, a boronic ester group and a borane group. In other embodiment, each monomer can be selected to contain one reactive boron derivate group independently selected from a boronic acid group, a boronic ester group and a borane group and one reactive halide group.

As mentioned above, the present materials will be useful in OLEDs. As such, a third aspect of the present invention provides an optical device for a component therefor which comprises a substrate and a material according to the first aspect of the present invention supported on the substrate.

Preferably, the optical device comprises an electroluminescent device. A preferred structure for an electroluminescent device comprises a first charge carrier injecting layer for injecting positive charge carriers, a second charge carrier injecting layer for injecting negative charge carriers, a light-emissive layer located between the charge carrier injecting layers for generating light and comprising a material according to the first aspect of the present invention.

According to a fourth aspect of the present invention, an electrically pumped organic laser comprising an emissive material according to the first aspect of the present invention also is provided.

The present invention now will be described in more detail with reference to the accompanying figures in which.

Figure 13:
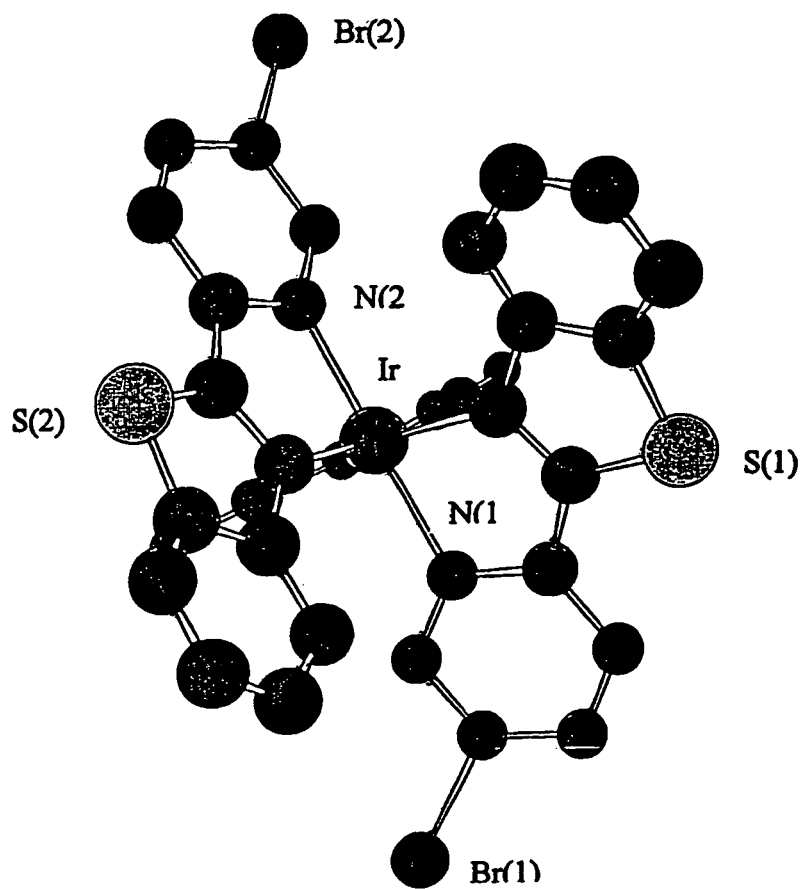
Figure 14:
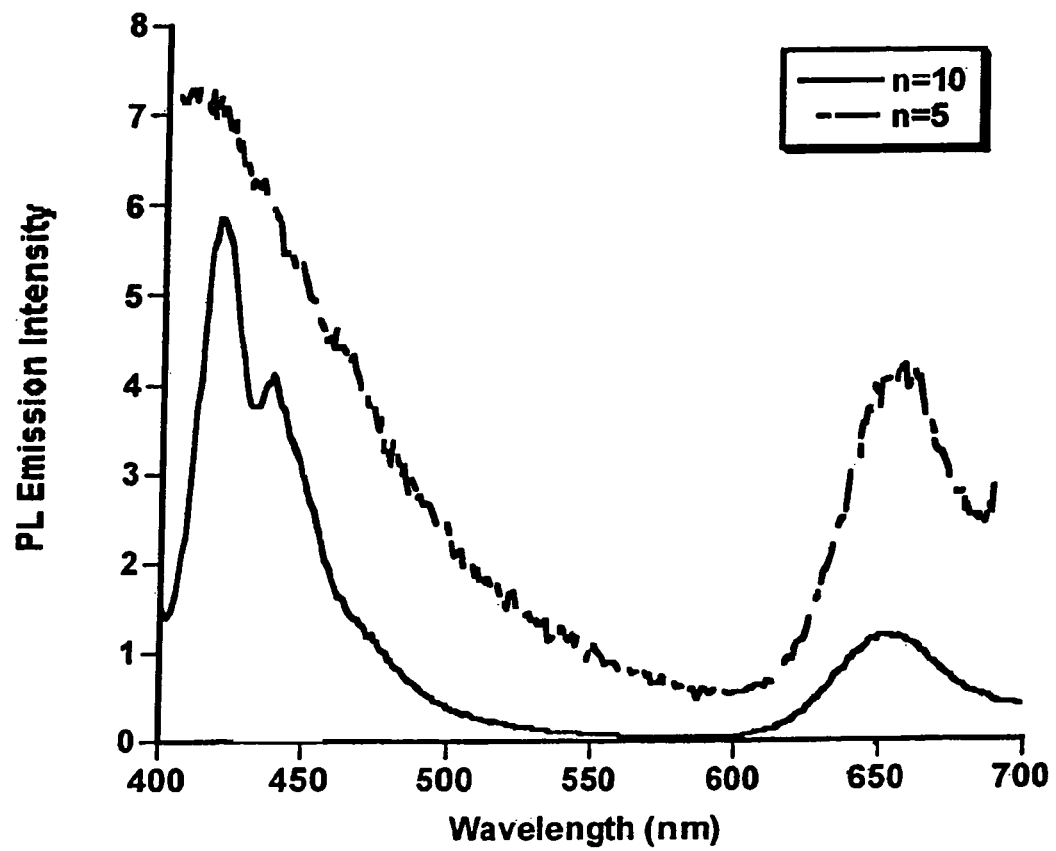
Figure 15:
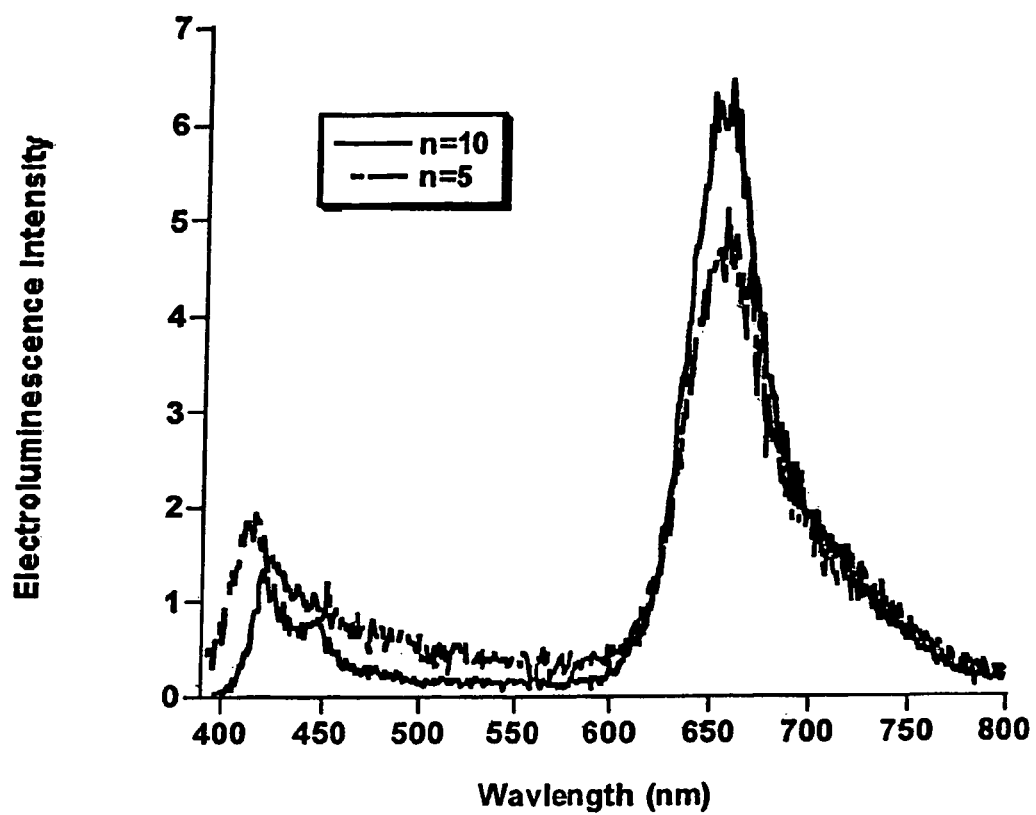

FIG. 13 shows an X-ray crystal structure of bis(2-(4-bromo-2-pyridyl)benzo(b)thiophene) (acac) iridium FIG. 14 shows the photoluminescence spectrum of a material of the invention comprising bis(2-(4-bromo-2-pyridyl)benzo(b)thiophene) (acac) iridium FIG. 15 shows the electroluminescence spectrum of a material of the invention comprising bis(2-(4-bromo-2-pyridyl)benzo(b)thiophene) (acac) iridium Examples of electron transport materials as possible ligands (L) in the organometallic are shown below:

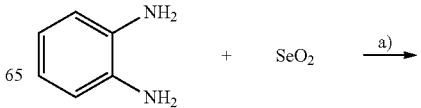

-continued

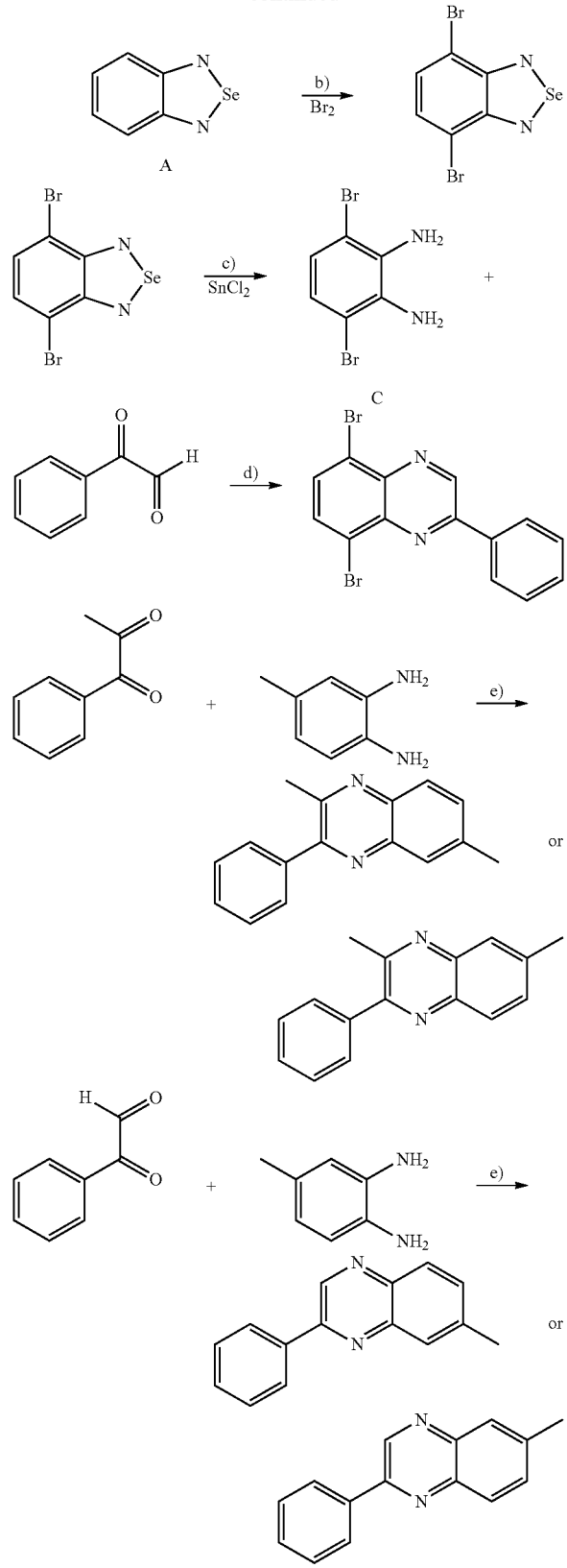

The above synthetic routes are assembled from synthetic pathways described in literature a) 10 min at 100° C. in H₂O/EtOH 1:1. b) 1 h at 20° C. in presence of Ag₂SO₄ in conc. H₂SO₄. c) 2 h at 70° C. in conc. HCl. d) 3 h at 100° C. in H₂O/EtOH. e) 3 h at 100° C. in H₂O/EtOH.

Examples of hole transport materials as possible ligands (L) in the organometallic are shown below:

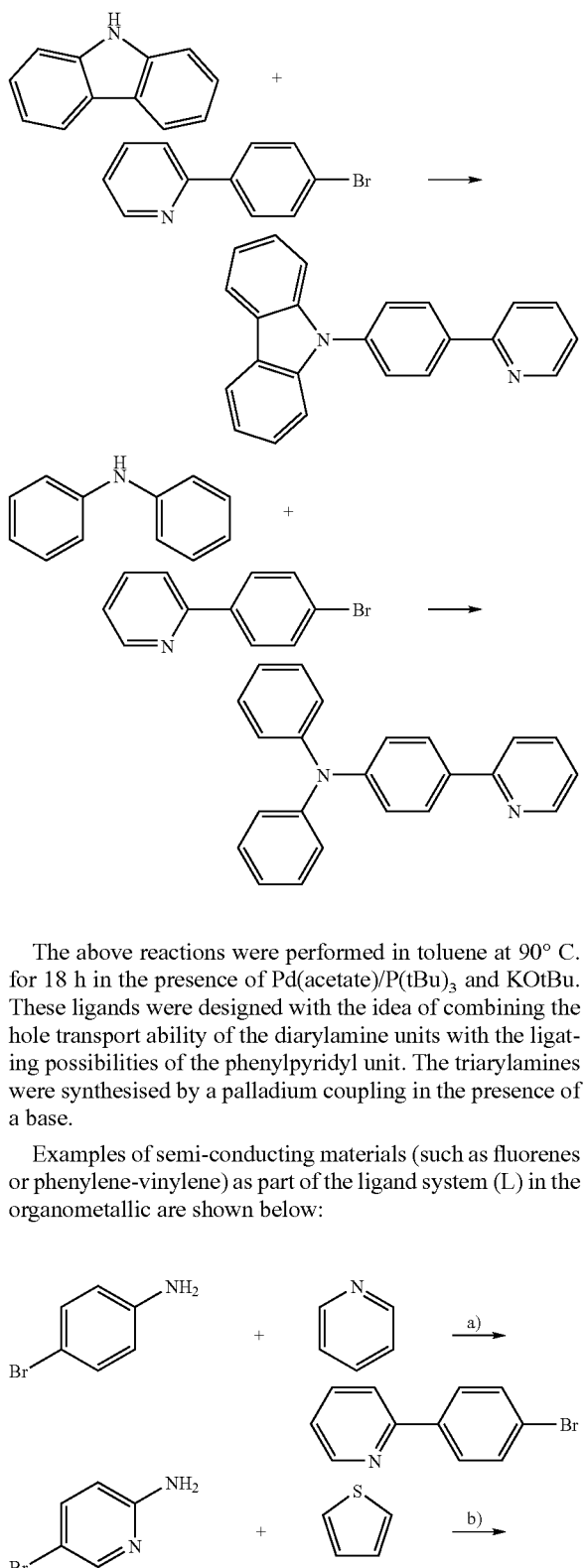

The above reactions were performed in toluene at 90° C. for 18 h in the presence of Pd(acetate)/P(tBu)₃ and KOtBu. These ligands were designed with the idea of combining the hole transport ability of the diarylamine units with the ligating possibilities of the phenylpyridyl unit. The triarylamines were synthesised by a palladium coupling in the presence of a base.

Examples of semi-conducting materials (such as fluorenes or phenylene-vinylene) as part of the ligand system (L) in the organometallic are shown below:

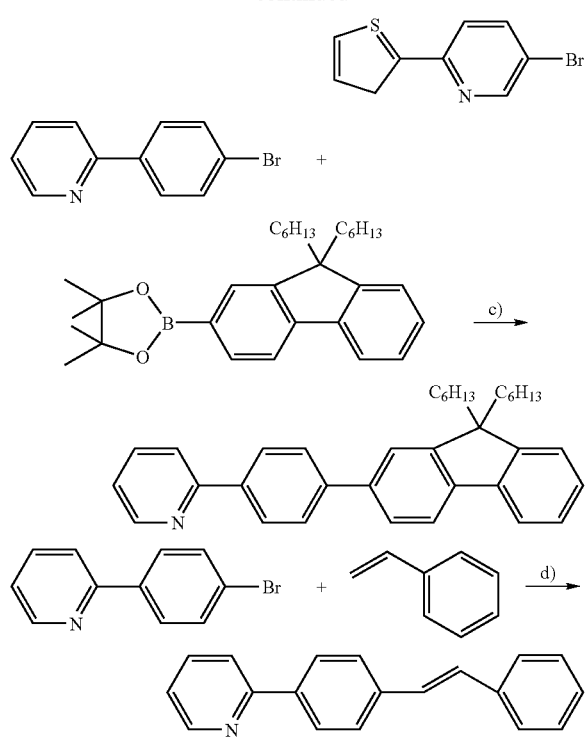

a) At 0° C. HCl was added to the p-bromoanilin and the resulting mixture was subsequently stirred in pyridine for 18 h at 40° C.
b) Reflux for 24 h in the presence of isoamylnitrate.
c) Reflux in THF for 18 h in the presence of Pd(PPh$_3$)$_4$ and Et$_4$NOH.
d) Heated at 80° C. in CH$_3$CN (or DMF) for several h in the presence of a Pd catalyst system; Pd(acetate)$_2$ or Pd$_2$(dba)$_3$ in combination with P(o-tolyl)$_3$ and a base; K$_2$CO$_3$ or Et$_3$N.

Bromide functionalised phenyl-pyridine and thenyl-pyridine ligands were synthesised to accomplish a straightforward coupling to fluorene-boronates using a Suzuki coupling. Model compounds, having one fluorene attached to the ligand were also synthesised.

Some complexes of these monomers are shown below:

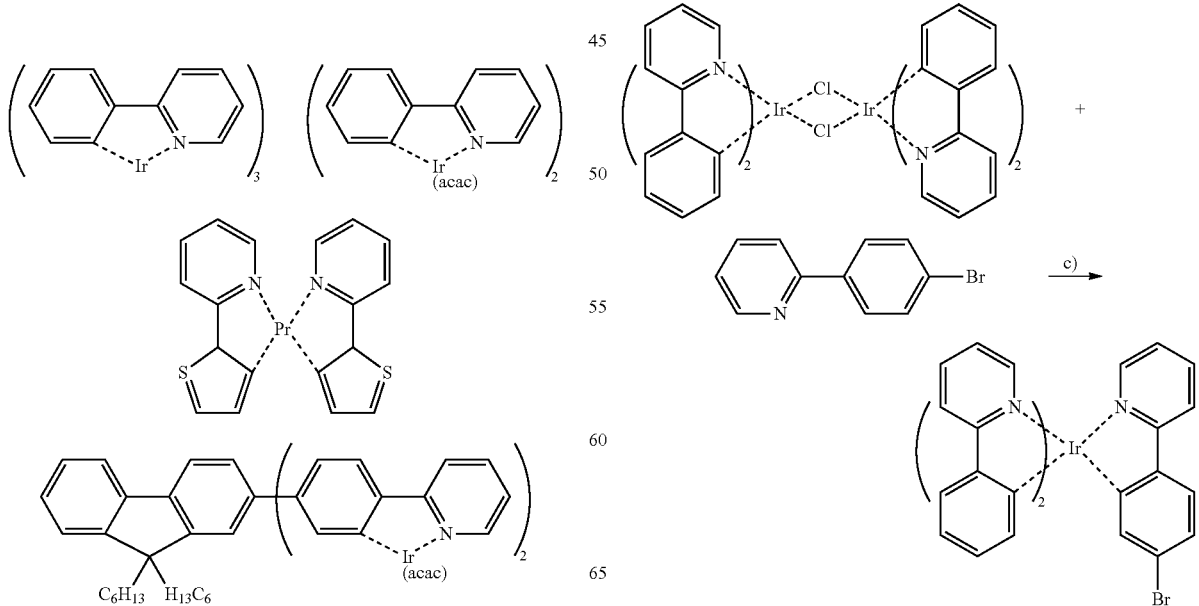

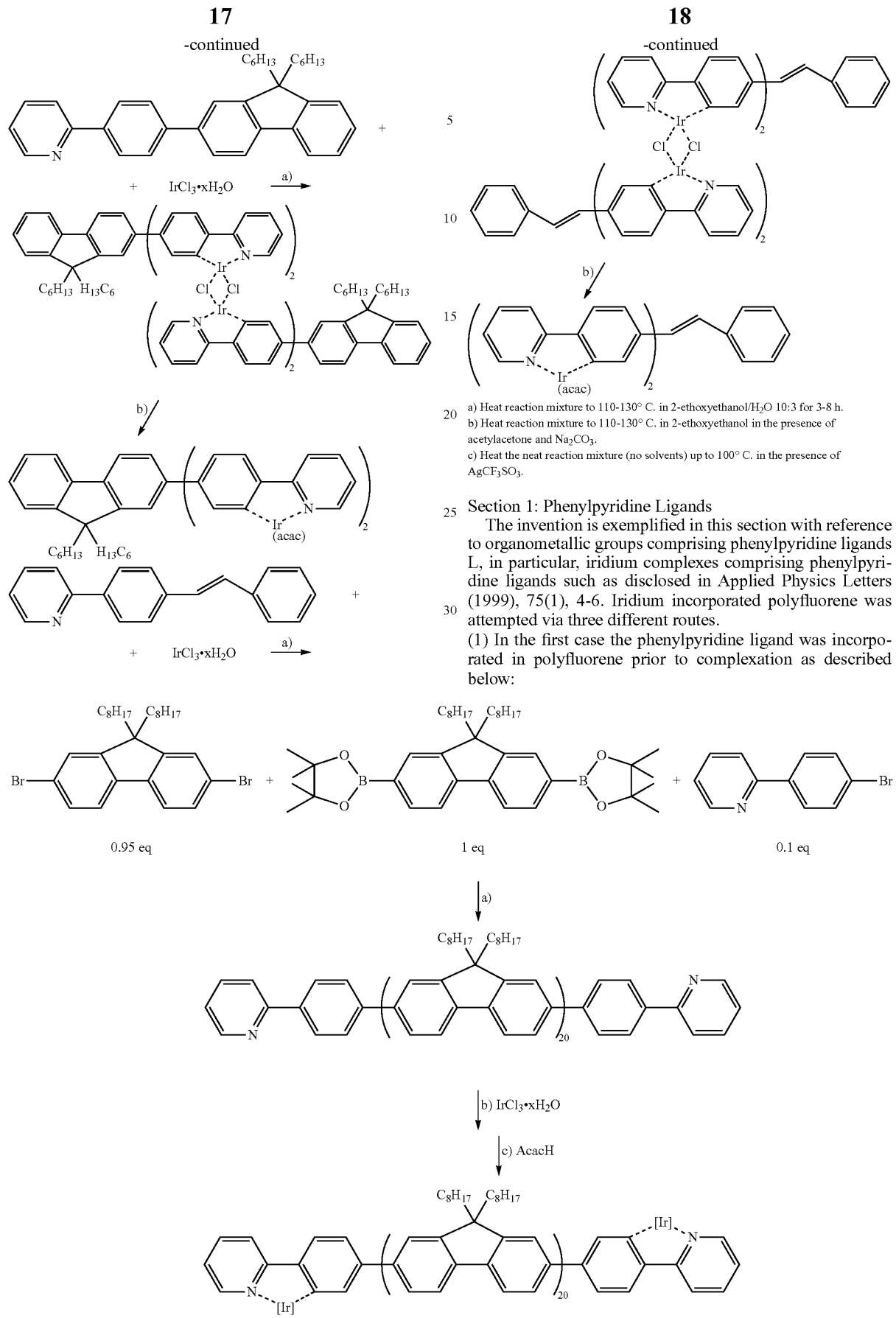

a) Heat reaction mixture to 110-130° C. in 2-ethoxyethanol/H₂O 10:3 for 3-8 h.
b) Heat reaction mixture to 110-130° C. in 2-ethoxyethanol in the presence of acetylacetone and Na₂CO₃.
c) Heat the neat reaction mixture (no solvents) up to 100° C. in the presence of AgCF₃SO₃.

Section 1: Phenylpyridine Ligands

The invention is exemplified in this section with reference to organometallic groups comprising phenylpyridine ligands L, in particular, iridium complexes comprising phenylpyridine ligands such as disclosed in Applied Physics Letters (1999), 75(1), 4-6. Iridium incorporated polyfluorene was attempted via three different routes.

(1) In the first case the phenylpyridine ligand was incorporated in polyfluorene prior to complexation as described below:

To a solution of 500 mg (0.78 mmol) of 2,7-di(4,4,5,5,-tetramethyl-1,3,2,-dioxaboronate)-9,9-dioctylfluorene, 405.5 mg (0.740 mmol) of 2,7-dibromo-9,9-dioctylfluorene and 17.1 mg (0.078 mmol) 2-(6-p-pyridyl-phenyl in 3 ml toluene was added: 4 mg (0.004 mmol) Pd(PPh$_3$)$_4$ and 2.5 ml of (3.1 mmol) Et$_4$NOH. The resulting mixture was stirred for 24 h at 100° C. After 3 h, 5 ml toluene was added to dissolve the precipitated oligomers or to rise the viscosity of the mixture. After the mixture was cooled down to 20° C. the mixture was slowly transferred in a large excess of MeOH, allowing the polymer to precipitate as a white (slightly greenish) fibre-like solid. The solids were collected on a filter, redissolved in 50 ml of toluene and subsequently filtered on a short column of silica. The filtrate was transferred into MeOH resulting in a reprecipitation of the polymer as off-white fibres. The solvents were removed under reduced pressure. $^1$H NMR (250 MHz CDCl$_3$): δ=8.72 (br d, 2H*12%; CH—N), 8.13 (br d, 2H*12%, CH—CH—CH—N), 7.5-7.9 (br, 12H, ArH), 2.0-2.3 (br, 4H)CH$_2$—C, 1.0-1.3 (br, 12H, CH$_2$), 0.7-0.9 (br, 10H, CH$_3$+CH$_2$). GPC: Mp 48586, Mn 18618, Mw 67120, polydispersity 3.6.

Next the iridium was introduced using the following method: A mixture of 200 mg (containing 0.159 mmol 2-(6-p-pyridyl-phenyl) and 283 mg containing 0.80 mmol of iridium) was transferred in a solvent mixture of 5 ml of toluene, 3 ml of H$_2$O and 3 ml of 2-ethoxyethanol. Upon heating the resulting clear dark purple mixture to 90° C. the polymer product starts to precipitate after a few hours. After 24 h the water phase was only slightly coloured and the reaction mixture was allowed to cool down to 20° C. Upon addition of 10 ml of H$_2$O to the mixture the polymer precipitated further as yellow fibres. The complete mixture was transferred in a large excess of MeOH and the precipitated polymer was subsequently collected on a filter, washed with water, methanol and acetone and dried under reduced pressure. Yield: 161 mg.

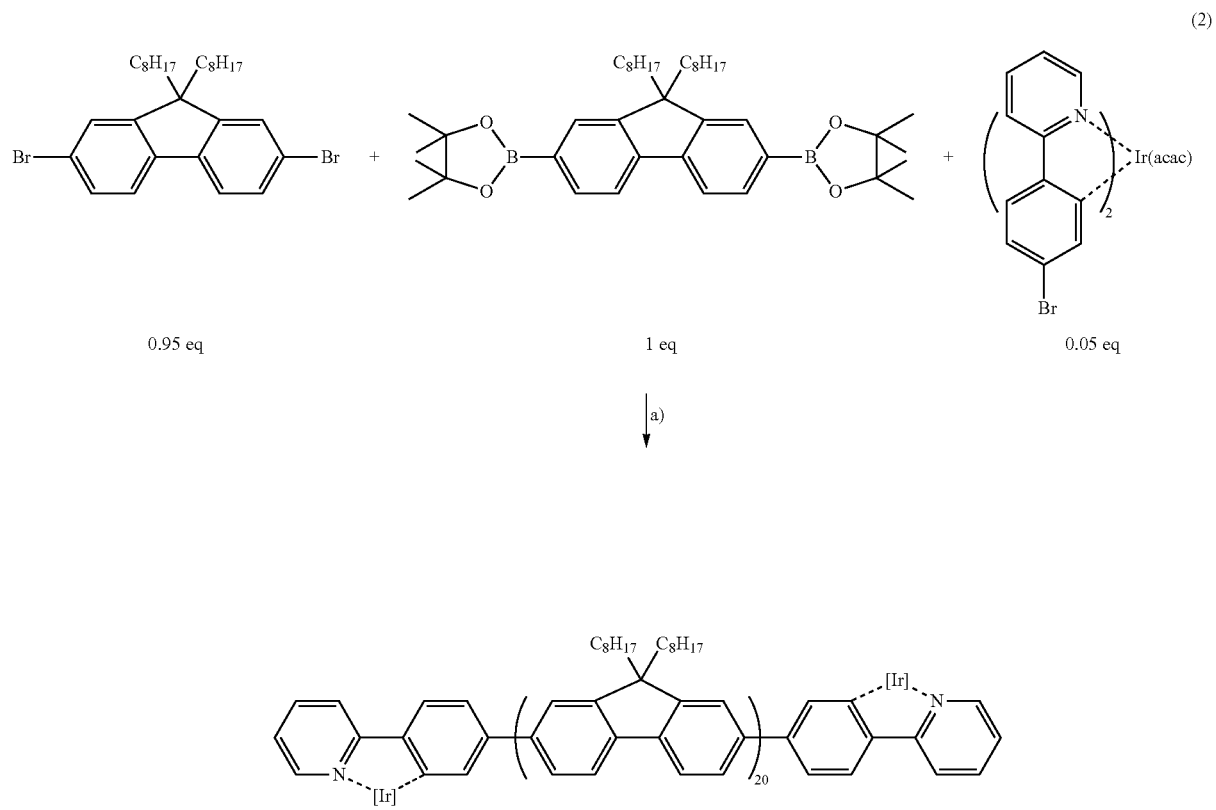

(2)

In the second approach 0.05 eq of bromide functionalised iridium compound was copolymerised in the Suzuki polymersation of polyfluorene to yield. The method was as follows: A polymer was synthesised starting with 500 mg (0.779 mmol) 2,7-di(4,4,5,5,-tetramethyl-1,3,2,-dioxaboronate)-9,9-dioctylfluorene, 405.5 mg (0.740 mmol) of 2,7-dibromo-9,9-dioctylfluorene and 29.5 mg (0.0389 mmol) (Ir(2(4-bromophenyl)pyridine)$_2$acac).

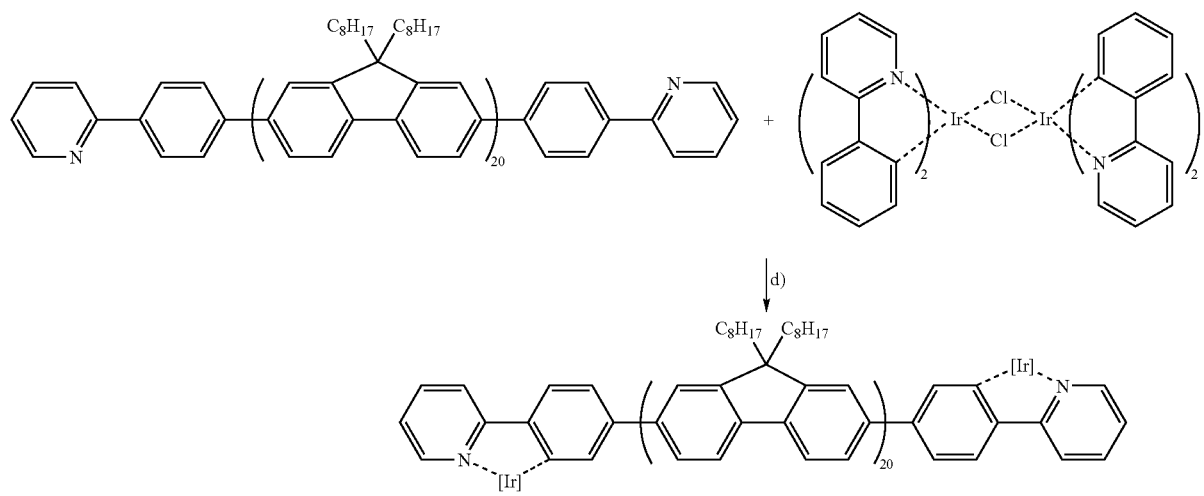

(3)

In the third route phenylpyridine equipped polyfluorene was reacted with [Ir(PhPy)$_2$μCl]$_2$ in the presence of a silver salt to yield. The method was as follows: A suspension of 180 mg (eq. of 0.143 mmol 2-phenylpyridine) of polyfluorene, 77 mg (0.072 mmol) of [Ir(2-phenylpyridine)$_2$μ-Cl]$_2$ and 37 mg (0.143 mmol) of AgCF$_3$SO$_3$ in 5 ml toluene was heated at 100° C. for 18 h. The resulting mixture was directly filtered over a short silica column, eluting with toluene. An off-white polymer was obtained upon removing the solvent from this fraction. The column was further eluted using toluene:MeOH 90:10. Hence a dark green polymer was obtained upon removing the solvents from this fraction under reduced pressure.

EXPERIMENTAL SECTION

To demonstrate the present invention, a study has been carried out on the attachment of subsequent fluorenyl segments to the 4-position of the ligand of a bis-cyclometalated iridium phosphor. The energy levels of the novel phosphors are shown to be complementary to polyfluorene after having attached a monofluorenyl substituent. It is shown furthermore that the stepwise addition of more fluorenyl segments to the phosphor gives rise to a gradual improvement of its performance as the emitting layer in an OLED device structure. The polyaddition to the phosphor was further extended towards the development of a polyfluorenyl-phosphor hybrid system.
Experimentals
General information All reactions and manipulations were routinely performed under an argon or nitrogen atmosphere using standard Schlenk techniques or a glovebox. Acetonitrile and dichloromethane were distilled from CaH$_2$ and toluene and THF were distilled from Na prior to use. Water, glycerol, 2-ethoxyethanol and a 20% Et$_4$NOH solution in water were degassed for several h before use. All other reagents and chemicals were reagent grade and were used as received from commercial suppliers. Column chromatography was performed using silica gel [Merck 9385 Kieselgel 60 (230-400 ASTM]. TLC was performed on 0.25 mm thick plates precoated with Merck Kieselgel 60 F$_{254}$ silica gel. $^1$H NMR spectra were recorded on Bruker DPX-250 (250 MHz), Bruker DRX-400 (400 MHz) and Bruker DRX-500 (500 MHz) instruments using CDCl$_3$ or C$_6$D$_6$ as an internal deuterium lock. Chemical shifts are in ppm relative to TMS and are indicated as: s(singlet), d(doublet), tr(triplet), q(quartet), br(broad), m(multiplet), dd(double doublet), dtr(double triplet) etc. $^{13}$C NMR spectra were recorded on Bruker DPX-250 (62.5 MHz) and Bruker DRX-400 (100 MWz) and a Bruker DRX-500 (121 MHz) instruments using an internal deuterium lock and proton decoupling. The multiplicity of the signal was determined by APT (Attached Proton Test) experiments. Mass spectra were recorded by the Mass Spectrometry Services in the University of Swansea. Electron Impact (IE) and Chemical Ionisation (CI) low resolution spectra were carried out on a VG model 12-253 under ACE conditions. Accurate mass measurements for EI and CI were performed on a +VG ZAB-E instrument. Melting points were determined using a Büchi 510 melting point apparatus, and are uncorrected.

Synthesis of A (2(4-bromophenyl)pyridine)[1,2]

At 0° C., a solution of 16.84 g (244 mmol) NaNO$_2$ in 30 ml H$_2$O was slowly added to a suspension of 20 g (116.4 mmol) p-bromoaniline in 40 ml concentrated HCl. The resulting mixture was stirred for an h at below 5° C. and was subsequently carefully poured in 500 ml pyridine. The resulting clear brown reaction mixture was stirred at 40° C. for 4 h. 200 g of Na$_2$CO$_3$ was added to the mixture and the slurry was stirred for 18 h at 40° C. The organic layer was dissolved in dichloromethane, extracted with water and dried with MgSO$_4$. The crude product was purified by flash column chromatography (toluene:MeOH 95:5). Yield: 8.4 g (33%), conciderable yields of 7-(p-bromophenyl)pyridine were obtained as the major side product. $^1$H NMR (500 MHz, CDCl$_3$): δ=8.68 (d, $^3$J=4.3 Hz, 1H; CH—N), 7.88 (d, $^3$J=8.4 Hz, 2H; CH—CH—Br), 7.75 (d, $^3$J=7.5 Hz, 1H; CH—CH—CH—N), 7.70 (d, $^3$J=7.8 Hz, 1H; CH—CH—CH—CH—N), 7.60 (d, $^3$J=8.4 Hz, 2H, CH—Br), 7.24 (br, 1H, CH—CH—N). $^{13}$C{$^1$H}NMR (500 MHz, CDCl$_3$): δ=156.2 (CN), 149.8 (CH—N), 138.3 (C—CN), 136.8 (CH—CH—CH—N), 131.9, 128.5 (Ar—CH), 123.4 (CBr), 122.4 (CH—CN), 120.2 (CH—CH—N). Exact Mass (IE) m/z: 233.9920 [M+H] (calcd. 233.9918 ($^{79}$Br)). C$_{11}$H$_8$BrN: calcd. C, 56.44; H, 3.44; N, 5.98. found C, 56.24; H, 3.35; N, 5.90.

Synthesis of B 2-(4,4,5,5 tetramethyl-1,3,2-dioxaborolane)-7-trimethylsilyl-9,9-dioctylfluorene At −78° C., 7.3 mL of a 1.7 M (12.5 mmol) tBuLi solution in hexanes was slowly added to a solution of 2.7 g (4.99 mmol) 2-bromo-7-trimethylsilyl-9,9-dioctylfluorene in THF. After 1 h, 1.2 g (6.48 mmol) of 2-isopropoxy-4,4,5,5 tetramethyl-1,3,2-dioxaborolane was added to the green solution at −78° C., after which the reaction mixture was allowed to warm up to room temperature. The resulting red solution turned colourless upon stirring for 18 h at room temperature. The product was extracted using dichloromethane/water and the crude product was purified by flash column chromatography (silica, 3% CDM in hexane). Yield 1.2 g (41%) product was obtained as colourless oil. $^1$H NMR (500 MHz, CDCl$_3$): δ=7.80 (d, $^3$J=7.5 Hz, 1H; ArH), 7.75 (s, 1H; ArH), 7.70 (d, $^3$J=7.5 Hz, 2H; ArH), 7.48 (d, $^3$J=7.5 Hz, 1H; ArH), 7.46 (s, 1H, ArH), 1.97 (tr, 4H, $^3$J=8.3 Hz, CH$_2$—C$\underline{H}_2$—C), 1.39 (s, 12H, C$\underline{H}_3$—C(O)), 1.05-1.15 (mp, 20H, CH$_2$), 0.81 (t, $^3$J=7.1 Hz, 6H; C$\underline{H}_3$—CH$_2$), 0.61 (mp, 4H; CH$_2$), 0.31 (s, 9H, CH$_3$—Si). $^{13}$C{$^1$H} NMR (500 MHz, CDCl$_3$): δ=150.4 ($\underline{C}$—C—CH$_2$), 150.1 ($\underline{C}$—C—CH$_2$), 144.1, 141.5, 139.6 (C), 133.6, 131.7, 128.9, 127.6, 119.3, 119.0 (CH), 83.7 (CO), 55.0 ($\underline{C}$—CH$_2$), 40.0 (C—$\underline{CH}_2$), 31.7, 30.0, 29.1, 29.0 (CH$_2$), 24.9 ($\underline{CH}_3$—CO), 23.6 (C—CH$_2$—$\underline{CH}_2$), 22.6 (CH$_3$—$\underline{CH}_2$), 14.0 ($\underline{CH}_3$—CH$_2$), 0.9 (CH$_3$—Si). Exact Mass (IE) m/z: 588.4534 [calcd 588.4534), fractions: 475.4 (m; [M-(C$_8$H$_{17}$)]$^+$), 363.3 (w; [M-(C$_8$H$_{17}$)$_2$]$^+$), 333.3 (m; [M-(C$_8$H$_{17}$+CH$_3$+C$_6$H$_{12}$BO$_2$)]$^+$). C$_{38}$H$_{71}$BO$_2$Si: calcd. C, 77.52; H, 10.44. found C, 77.35; H, 10.33.

Synthesis of C 2-(4,4,5,5 tetramethyl-1,3,2-dioxaborolane)-7-bromo-9,9-dioctylfluorene At −78° C., 4.8 mL of a 1.6M (7.66 mmol) nBuLi solution in hexanes was slowly added to a solution of 4 g (7.30 mmol) of 2,7-dibromo-9,9-dioctylfluorene in 50 mL of diethylether. The resulting white milky solution was allowed to cool to 0° C. until a clear-yellow solution was formed that was cooled back to −78° C. again. 1.49 g (8.03 mmol) of 2-isopropoxy-4,4,5,5 tetramethyl-1,3,2-dioxaborolane was added and the resulting mixture turned white turbid after 1 h. The mixture was subsequently allowed to cool to room temperature and stirred for 18 h. After the mixture was quenched with water, the organic layer was dried on MgSO$_4$ and the solvent was removed under reduced pressure. The crude product was purified using flash column chromatography (silica, dichloromethane, Rf: 0.5). Yield: 2.2 g (51%). $^1$H NMR (500 MHz, CDCl$_3$): δ=7.80 (d, $^3$J=7.6 Hz, 1H; ArH), 7.72 (s, 1H; ArH), 7.66 (d, $^3$J=7.5 Hz, 1H; ArH), 7.57 (d, $^3$J=7.5 Hz, 1H; ArH), 7.47 (s, 1H, ArH), 7.45 (d, $^3$J=7.5 Hz, 1H, ArH), 1.97 (mp, 2H, CH$_2$—C$\underline{H}_2$—C), 1.91 (mp, 2H, CH$_2$—C$\underline{H}_2$—C), 1.39 (s, 12H, C$\underline{H}_3$—C(O)), 1.02-1.18 (mp, 20H, CH$_2$), 0.82 (t, $^3$J=7.1 Hz, 6H; C$\underline{H}_3$—CH$_2$), 0.56 (mp, 4H; CH$_2$). $^{13}$C{$^1$H} NMR (500 MHz, CDCl$_3$): δ 153.3, 149.2 ($\underline{C}$—C—CH$_2$), 142.7, 139.7 (ArC), 127.9 (very weak) (C—B), 133.6, 129.6, 128.6, 126.0, 121.2, 118.8 (CH), 83.5 (CO), 55.2 ($\underline{C}$—CH$_2$), 39.9 (C-$\underline{CH}_2$), 31.5, 29.6, 28.91, 28.88 (CH$_2$), 24.6 (C—$\underline{CH}_3$), 23.4 (C—CH$_2$—$\underline{CH}_2$), 22.3 ($\underline{CH}_2$—CH$_3$), 13.8 ($\underline{CH}_2$—CH$_3$). C$_{35}$H$_{52}$BBrO$_2$: calcd. C, 70.59; H, 8.80. found C, 70.25; H, 8.47.

Synthesis of D (2-(6-p-pyridyl-phenyl)-9,9-dihexylfluorene)

A mixture of 500 mg (1.12 mmol) of 2-(4,4,5,5,-tetramethyl-1,3,2,-dioxaboronate)-9,9-dihexylfluorene, 261 mg (1.12 mmol) of 2(4-bromophenyl)pyridine, 0.5 mg (0.01 mmol) Pd(PPh$_3$)$_4$, 2 ml of a 20% Et$_4$NOH in water in 4 ml toluene was stirred at 90° C. for 18 h. The clear brown-orange mixture was taken in dichloromethane, washed with water and finally dried with MgSO$_4$. The crude product was purified by flash column chromatography (DCM). Yield 255 mg (47%). $^1$H NMR (250 MHz, CDCl$_3$): δ=8.73 (d, $^3$J=4.9 Hz, 1H; CH—N), 8.12 (d, $^3$J=8.2 Hz, 2H; C$\underline{H}$—C—C(CH)—N), 7.80-7.78 (mp, 4H, ArH), 7.73 (d, $^3$J=7.8 Hz, 1H, C$\underline{H}$—CH—CH—N), 7.64 (d, $^3$J=7.9, 1H; C$\underline{H}$—CH—N), 7.62 (br, 1H; C$\underline{H}$—CH—N), 7.36-7.33 (mp, $^3$J=1.0 Hz and 7.5 Hz, 3H; ArH), 7.25 (mp, 2H, ArH), 2.00-2.04 (dd, $^3$J=5.0 Hz and 5.2 Hz, 4H; C$\underline{H}_2$—C), 1.05-1.15 (mp, 12H, CH$_2$), 0.78 (t, $^3$J=6.7 Hz, 6H; CH$_3$), 0.68 (mp, 4H; CH$_2$). $^{13}$C{$^1$H} NMR (500 MHz, CDCl$_3$): δ=156.8 (CN), 151.2, 150.8 ($\underline{C}$—C—CH$_2$), 149.5 (CH—N), 142.0, 140.5, 139.1, 137.8 (ArC), 136.5 ($\underline{CH}$—CH—CH—N), 127.2, 127.0, 126.8, 126.5, 126.0, 122.7, 121.8, 121.1, 120.2, 119.7, 119.5 (CH), 54.9 ($\underline{C}$—CH$_2$), 40.2 (C—$\underline{CH}_2$), 31.2, 29.5 (CH$_2$), 23.5 (C—CH$_2$—$\underline{CH}_2$), 22.3 (CH$_3$—$\underline{CH}_2$), 13.7 (CH$_3$). Exact Mass (IE): 488.3317 [M+H] (calcd. 488.3317); fractions m/z: 402.3 (s, [M-(C$_6$H$_{13}$)]$^+$): 332.2 (s, [M-(C$_6$H$_{13}$)—(C$_5$H$_{11}$)]$^+$) 318.2 (s, [M-(C$_6$H$_{13}$)$_2$]$^+$). C$_{36}$H$_{41}$N: calcd. C, 88.65; H, 8.47; N, 2.87. found C, 88.37; H, 8.40; N, 3.11.

Synthesis of E Suzuki Polymerisation of 9,9-di-n-octylfluorene containing 2-(6-p-pyridyl-phenyl Endgroup on One Side To a solution of 500 mg (0.56 mmol) of 2-(4,4,5,5,-tetramethyl-1,3,2,-dioxaboronate)-7-bromo-9,9-dioctylfluorene and 13.1 mg (0.056 mmol) 2-(6-p-pyridyl-phenyl in 5 ml toluene was added: 4 mg (0.004 mmol) Pd(PPh$_3$)$_4$ and 2.5 ml of a 20% (3.1 mmol) Et$_4$NOH solution in water. The resulting mixture was stirred for 24 h at 110° C. After the mixture was cooled down to 20° C. the mixture was slowly transferred in a large excess of MeOH, allowing the polymer to precipitate as a yellow-white solid. The solids were collected on a filter, redissolved in 50 ml of toluene and subsequently filtered on a short column of silica. The filtrate was transferred into MeOH resulting in a reprecipitation of the polymer as off-white fibres. The solvents were removed under reduced pressure. $^1$H NMR (250 MHz, CDCl$_3$): δ=8.75 (br d, 2H*12%; CH—N), 8.13 (br d, 2H*12%, C$\underline{H}$—CH—CH—N), 7.5-7.9 (br, 6H, ArH), 2.0-2.3 (br, 4H, CH$_2$—C), 1.0-1.3 (br, 20H, CH$_2$), 0.7-0.9 (br, 10H, CH$_3$+CH$_2$). Mw (NMR): 5000 (12-mer).

Synthesis of F 2-(6-p-pyridyl-phenyl)-7-trimethylsilyl-9,9-dioctylfluorene

To a solution of 243 mg (1.021 mmol) of (2(4-bromophenyl)pyridine), 600 mg (1.021 mmol) of 2-(4,4,5,5 tetramethyl-1,3,2-dioxaborolane)-7-trimethylsilyl-9,9-dioctylfluorene in 10 mL of toluene was added: 4 mg (0.004 mmol) Pd(PPh$_3$)$_4$ and 2.5 ml of a 20% (3.1 mmol) Et$_4$NOH solution in water. This two-phase reaction mixture was stirred for 48 h at 110° C. after which it was extracted using dichloromethane/water. The organic layer was dried using MgSO$_4$ and the solvents were removed under reduced pressure. The crude product was purified using flash chromatography (dichloromethane, Rf: 0.47). 550 mg (88%) product was obtained as an off-white solid. $^1$H NMR (250 MHz, CDCl$_3$): δ=8.73 (d, $^3$J=4.9 Hz, 1H; CH—N), 8.12 (d, $^3$J=8.3 Hz, 2H; C$\underline{H}$—C—C(CH)—N), 7.80-7.78 (mp, 4H, ArH), 7.73 (d, $^3$J=4.5 Hz, 2H, C$\underline{H}$—CH—CH—N), 7.69 (d, $^3$J=4.6 Hz, 2H; C$\underline{H}$—CH—N), 7.63 (d, $^3$J=8.0 Hz, 2H; C$\underline{H}$—CH—N), 7.25

(s, 1H; ArH), 2.01 (tr, $^3J$=8.2 Hz, 4H; C$\underline{H}_2$—C), 1.05-1.15 (mp, 20H, CH$_2$), 0.78 (t, $^3J$=6.6 Hz, 6H; CH$_3$), 0.70 (mp, 4H; CH$_2$), 0.32 (s, 9H; CH$_3$—Si). $^{13}$C{$^1$H} NMR (500 MHz, CDCl$_3$): δ=156.8 (CN), 151.5, 149.9 ($\underline{C}$—C—CH$_2$), 149.5 (CH—N), 142.0, 141.1, 140.4, 139.2, 138.9, 137.8 (ArC), 136.5 ($\underline{C}$H—CH—CH—N), 131.6, 127.4, 127.2, 127.0, 125.7, 121.8, 121.2, 120.1, 119.8, 118.8 (CH), 54.9 ($\underline{C}$—CH$_2$), 39.9 (C—$\underline{C}$H$_2$), 31.5, 28.9, 28.8 (CH$_2$), 29.7 (C—CH$_2$—CH$_2$—$\underline{C}$H$_2$) 23.5 (C—CH$_2$—$\underline{C}$H$_2$), 22.3 (CH$_3$—$\underline{C}$H$_2$), 13.8 (CH$_2$—$\underline{C}$H$_3$), -1.1 (Si—$\underline{C}$H$_3$). Exact Mass (IE): [M+H]: 616.4340 (calcd. 616.4338). C$_{43}$H$_{57}$NSi: calcd. C, 83.84; H, 9.33; N, 2.27. found C, 83.99; H, 9.41; N, 2.33.

Synthesis of G
2-(6-p-pyridyl-phenyl)-7-iodo-9,9-dioctylfluorene 1.5 ml of an 1.0 M ICl solution in MeOH was slowly added to a solution of 500 mg (0.813 mmol) of 2-(6-p-pyridyl-phenyl)-7-trimethylsilyl-9,9-dioctylfluorene in 5 mL of dichloromethane. The resulting darkred solution was stirred for 2 h at room temperature after which the reaction mixture was quenched with a large excess of a Na$_2$S$_2$O$_3$ in water. The mixture was extracted with water, and the organic fraction was dried using MgSO$_4$ and the solvents were removed under reduced pressure. The product was purified using flash column chromatography (dichloromethane: Rf: 0.36). 450 mg (85%) product was obtained as a highly blue fluorescent, colourless solid material. $^1$H NMR (250 MHz, CDCl$_3$): δ=8.73 (d, $^3J$=4.7 Hz, 1H; CH—N), 8.12 (d, $^3J$=8.5 Hz, 2H; C$\underline{H}$—C—C(CH)—N), 7.80-7.73 (mp, 4H, ArH), 7.68 (s, 2H, ArH), 7.65 (d, $^3J$=5.0 Hz, 2H; C$\underline{H}$—CH—N), 7.60 (s, 2H, ArH), 7.48 (d, 1H; $^3J$=8.4 Hz; ArH), 2.05-1.94 (mp, 4H; C$\underline{H}_2$—C), 1.05-1.25 (mp, 20H, CH$_2$), 0.81 (t, $^3J$=6.6 Hz, 6H; CH$_3$), 0.70 (br m, 4H, CH$_2$). $^{13}$C{$^1$H} NMR (500 MHz, CDCl$_3$): δ=157.0 (CN), 153.4, 150.9 ($\underline{C}$—C—CH$_2$), 149.8 (CH—N), 142.0, 140.4, 140.0, 139.6, 138.2 (ArC), 136.8 ($\underline{C}$H—CH—CH—N), 135.9, 132.1 ($\underline{C}$—CI), 127.5, 127.3, 126.1, 122.1, 121.5, 121.3, 120.4, 120.1 (CH), 92.6 (CI), 55.5 ($\underline{C}$—CH$_2$), 40.2 (C—$\underline{C}$H$_2$), 31.7, 29.9, 29.2, 29.1 (CH$_2$), 23.7 (C—CH$_2$—$\underline{C}$H$_2$), 22.6 (CH$_3$—$\underline{C}$H$_2$), 14.1 (CH$_3$). Exact Mass (IE) m/z: 669.2825 [M]$^+$ (calcd. 669.2832) fractions: 543.6 (m; [M-I]$^+$), 318.4 (m; [M-(C$_8$H$_{17}$)—I]$^+$). C$_{40}$H$_{48}$IN: calcd. C, 71.74; H, 7.22; N, 2.09. found C, 72.34; H, 7.20; N, 2.12.

Synthesis of H 2-(6-p-pyridyl-phenyl)-7-(9,9-dihexylfluorenyl)-9,9-dioctylfluorene To a solution of 400 mg (0.60 mmol) of 2-(6-p-pyridyl-phenyl)-7-iodo-9,9-dioctylfluorene, 362 mg (0.60 mmol) of 2-(4,4,5,5 tetramethyl-1,3,2-dioxaborolane)-9,9-dihexylfluorene in 10 mL of toluene was added: 4 mg (0.004 mmol) Pd(PPh$_3$)$_4$ and 2.5 ml of an 20% (3.1 mmol) Et$_4$NOH solution in water. This two-phase reaction mixture was stirred for 48 h at 110° C. after which it was extracted using dichloromethane/water. The organic layer was dried on MgSO$_4$ and the solvents were removed under reduced pressure. The crude product was purified using flash chromatography. Yield 450 mg (86%). $^1$H NMR (400 MHz, CDCl$_3$): δ=8.74 (d, $^3J$=4.9 Hz, 1H; CH—N), 8.13 (d, $^3J$=4.6 Hz, 2H; C$\underline{H}$—C—C(CH)—N), 7.84-7.77 (mp, 6H, ArH), 7.74 (d, $^3J$=6.0 Hz, 2H, C$\underline{H}$—CH—CH—N), 7.69-7.63 (mp, 6H; ArH), 7.39-7.30 (mp, 3H; ArH), 7.27-7.24 (mp, 1H (obscured by CDCl$_3$ peak; ArH), 2.11-2.02 (mp, 8H, C—CH$_2$), 1.18-1.09 (mp, 32H, CH$_2$), 0.81-0.74 (mp, 20H, C$\underline{H}_2$—C$\underline{H}_3$). $^{13}$C{$^1$H} NMR (500 MHz, CDCl$_3$): δ=157.1 (CN), 151.8, 151.4, 151.0 ($\underline{C}$—C—CH$_2$), 149.8 (CH—N), 142.2, 140.8, 140.6, 140.42; 140.39, 140.3, 139.9, 139.3, 138.1 (ArC), 136.8 ($\underline{C}$H—CH—CH—N), 127.5, 127.3, 126.9, 126.8, 126.1, 126.0, 122.1, 122.0, 121.44, 121.38, 120.4, 120.0, 119.8, 119.7 (CH), 55.3, 55.1 ($\underline{C}$—CH$_2$), 40.4 (C—$\underline{C}$H$_2$), 31.7, 31.5, 30.0, 29.7, 29.18, 29.16 (CH$_2$), 23.8, 23.7 (C—CH$_2$—$\underline{C}$H$_2$), 22.6, 22.5 (CH$_3$—$\underline{C}$H$_2$), 14.03, 13.99 (CH$_3$). Exact Mass (IE): 875.6367 [M]+(calcd 875.6369) fractions m/z: 762.3 (m; [M-(C$_8$H$_{17}$)]$^+$, 650.4 (m; [M-(C$_8$H$_{17}$)$_2$]$^+$. C$_{65}$H$_{81}$N: calcd. C, 89.09; H, 9.32; N, 1.60. found: C, 88.60; H, 9.25; N, 1.52.

Synthesis of J (Via I) 2-(6-p-pyridyl-phenyl)-7-(2-(7-iodo-9,9-dioctylfluorenyl)-9,9-dioctylfluorene To a solution of 300 mg (0.448 mmol) of 2-(6-p-pyridyl-phenyl)-7-iodo-9,9-dioctylfluorene, 320 mg (0.544 mmol) of 2-(4,4,5,5 tetramethyl-1,3,2-dioxaborolane)-7-trimethylsilyl-9,9-dioctylfluorene in 10 mL of toluene was added: 4 mg (0.004 mmol) Pd(PPh$_3$)$_4$ and 2.5 ml of a 20% (3.1 mmol) Et$_4$NOH solution in water. This two-phase reaction mixture was stirred for 24 h at 110° C. after which it was extracted using dichloromethane/water. The organic layer was dried and the solvents were removed under reduced pressure. The crude product was purified using flash chromatography (dichloromethane, Rf: 0.30). 392 mg (88%) of product I was obtained as a colourless solid. This was subsequently dissolved in 5 ml of dichloromethane and 5 mL of 1.0 M solution of ICl in MeOH was added. The resulting darkred solution was stirred for 2 h at room temperature after which the reaction mixture was queched with a large excess of a Na$_2$S$_2$O$_3$ solution in water. The reaction mixture was subsequently extracted (dichloromethane/water). The organic phase was dried on MgSO$_4$ and the solvents were removed under reduced pressure. The crude product was purified using column chromatography (silica, dichloromethane). Yield: 355 mg (85%). $^1$H NMR (400 MHz, CDCl$_3$): δ=8.74 (d, $^3J$=4.6 Hz, 1H; CH—N), 8.13 (d, $^3J$=8.4 Hz, 2H; C$\underline{H}$—C—C(CH)—N), 7.82-7.78 (mp, 5H, ArH), 7.75 (d, $^3J$=7.9 Hz, 2H, C$\underline{H}$—CH—CH—N), 7.69-7.64 (mp, 5H; ArH), 7.60 (d, 2H; ArH), 7.48 (d, 1H; C$\underline{H}$—CH—N) 7.26-7.24 (mp, 2H (obscured by CDCl$_3$ peak ArH), 2.17-1.94 (mp, 8H, C—CH$_2$), 1.24-1.09 (mp, 40H, CH$_2$), 0.90-0.71 (mp, 20H, C$\underline{H}_2$C$\underline{H}_3$). $^{13}$C{$^1$H} NMR (500 MHz, CDCl$_3$): δ=157.0 (CN), 153.4, 151.83, 151.77, 150.9 ($\underline{C}$—C—CH$_2$), 149.8 (CH—N), 142.1, 141.1, 140.5, 140.4, 140.3, 140.1, 139.4, 139.3, 138.1 (ArC), 136.8 ($\underline{C}$H—CH—CH—N), 135.9, 132.1 ($\underline{C}$—CI), 127.5, 127.3, 126.24, 126.16, 126.1, 122.1, 121.4, 121.3, 120.4, 120.1, 120.0 (CH, 3 CH signals obscured by exact overlap), 92.5 (CI), 55.5, 55.3 ($\underline{C}$—CH$_2$), 40.4, 40.2 (C—$\underline{C}$H$_2$), 31.77, 31.76, 29.19, 29.17 (CH$_2$), 29.99, 29.93 (C—CH$_2$—CH$_2$—$\underline{C}$H$_2$) 23.8, 23.7 (C—CH$_2$—$\underline{C}$H$_2$), 22.60, 22.58 (CH$_3$—$\underline{C}$H$_2$), 14.08, 14.05 (CH$_3$). Exact Mass (IE): [M+H] (calcd.); fractions m/z: 1058.7 (s, [M]$^+$), 944.4 (m, [M-(C$_8$H$_{17}$)]$^+$. C$_{69}$H$_{88}$IN: calcd. C, 78.30; H, 8.38; N, 1.32. found. C, 78.02; H, 8.31; N, 1.35.

Synthesis of K 2-(6-p-pyridyl-phenyl)-7-(2-(7-[2-(9,9-dihexylfluorenyl)]))-9,9-dioctylfluorenyl)-9,9-dioctylfluorene To a solution of 300 mg (0.287 mmol) of 2-(6-p-pyridyl-phenyl)-7-(2-(7-iodo-9,9-dioctylfluorenyl)-9,9-dioctylfluorene, 225 mg (0.373 mmol) of 2-(4,4,5,5 tetramethyl-1,3,2-dioxaborolane)-7-trimethylsilyl-9,9-dioctylfluorene in 5 mL of toluene was added: 4 mg (0.004 mmol) Pd(PPh$_3$)$_4$ and 2.5 ml of a ?% (3.1 mmol) Et$_4$NOH solution in water. This two-phase reaction mixture was stirred for 24 h at 1110° C. after which it was extracted using dichloromethane/water. The organic layer was dried and the solvents were removed under reduced pressure. The crude product was purified using flash chromatography (silica/dichloromethane:hexane 1:1, Rf: 0.24). Yield: 190 mg (52%) of a colourless, highly blue fluorescent solid. %). $^1$H NMR (250 MHz, CDCl$_3$): δ=8.75 (d, $^3$J=4.6 Hz, 1H; CH—N), 8.14 (d, $^3$J=8.4 Hz, 2H; CH—C—C(CH)—N), 7.86-7.73 (mp, 10H, ArH), 7.74-7.62 (mp, 10H, ArH), 7.40-7.31 (mp, 3H, ArH), 7.28-7.23 (mp, 1H (obscured by CDCl$_3$), ArH), 2.17-2.02 (mp, 12H, C—CH$_2$), 1.25-1.01 (mp, 52H, CH$_2$), 0.90-0.64 (mp, 30H, C$\underline{H_2}$—C$\underline{H_3}$).
$^{13}$C{$^1$H} NMR (500 MHz, CDCl$_3$): δ=157.1 (CN), 151.8, 151.4, 151.0 ($\underline{C}$—C—CH$_2$), 149.7 (CH—N), 142.2, 140.8, 140.6, 140.5, 140.47, 140.44, 140.39, 140.30, 139.95, 139.90 (ArC), 136.7 ($\underline{C}$H—CH—CH—N), 127.4, 127.3, 126.8, 126.1, 126.0, 122.9, 121.44, 121.40, 120.38, 120.0, 119.9, 119.8, 119.7 (CH), 55.33, 55.31, 55.1 ($\underline{C}$—CH$_2$), 40.3 (C—$\underline{C}$H$_2$), 31.7, 31.4, 30.0, 29.7, 29.2 (CH$_2$), 23.9, 23.8 (C—CH$_2$—$\underline{C}$H$_2$), 22.6, 22.5 (CH$_3$—$\underline{C}$H$_2$), 14.01, 13.97 (CH$_3$). Mass (IE) m/z; 1265 [M+H]$^+$. C$_{94}$H$_{121}$N: calcd. C, 89.25; H, 9.64; N, 1.1. found C, 89.25; H, 9.71; N, 1.21.

Synthesis of [Ir(2(4-bromophenyl)pyridine)$_2$μ-Cl]$_2$$^3$

A mixture of 500 mg (1.42 mmol Ir) IrCl$_3$.xH$_2$O and 1.4 g (6.37 mmol) of 2(4 bromophenyl)pyridine in 50 ml 2-ethoxyethanol and 15 ml H$_2$O was heated to 110° C. for 18 h. A yellow precipitate started to form after 1 h. After the mixture was allowed to cool down to 20° C., the precipitate was collected on a fritted glass filter, washed with EtOH:H$_2$O 95:5, dissolved in acetone and dried on MgSO$_4$. The solvent was removed under reduced pressure. Yield 639 mg (65%). $^1$H NMR (250 MHz, CDCl$_3$): δ 9.12 (d, $^3$J=5.7 Hz, 4H; CH—N), 7.86 (d, $^3$J=4.5 Hz, 4H; C$\underline{H}$—CH—CBr), 7.80 (dtr, $^4$J=1.5 Hz and $^3$J=7.2 Hz, 4H; CH—C$\underline{H}$—Br), 7.38 (d, $^3$J=9.4 Hz, 4H; C$\underline{H}$—CH—CH—N), 7.02 (dd, $^3$J=1.9 Hz and 9.0 Hz, 4H; CH—C(C)N), 6.84 (dtr, $^4$J=1.7 Hz and $^3$J=5.6 Hz, 4H; C$\underline{H}$—CH—N), 5.94 (d, $^4$J=1.9 Hz, 4H; CH—C(C)—Ir). Mass (FAB): m/z 1387 (w, [M]$^+$), 1352, (w, [M-Cl]$^+$), 659 (s, [Ir(A)$_2$]$^+$). C$_{44}$H$_{32}$Br$_4$Cl$_2$Ir$_2$N$_4$: calcd. C, 38.08; H, 2.03; N, 4.04. found C, 37.73; H, 2.10; N, 4.04.

Synthesis of M (Ir(2(4-bromophenyl)pyridine)$_2$acac)$^4$ 300 mg (0.216 mmol) of [Ir(2(4-bromophenyl)pyridine)$_2$μ-Cl]$_2$ was dissolved in 30 ml 2-ethoxyethanol in the presence of 108 mg (1.08 mmol) acacH and 216 mg (2.04 mmol) Na$_2$CO$_3$. The resulting yellow suspension was stirred at 110° C. for 8 h. After the mixture was allowed to cool down to 20° C. 10 ml of H$_2$O was added. The yellow precipitate was collected on a fritted glass filter, washed with H$_2$O, hexane and with cold Et$_2$O, and dried under reduced pressure. Yield: 190 mg (58%). $^1$H NMR (250 MHz, CDCl$_3$): δ=8.44 (d, $^3$J=5.5 Hz, 2H; CH—N), 7.83 (d, $^3$J=8.5 Hz, 2H, C$\underline{H}$—CH—CH—N), 7.78 (mp, $^3$J=5.5 Hz and $^4$J=1.5 Hz, 2H; C$\underline{H}$—CH—N), 7.41 (d, $^3$J=8.3 Hz, 2H; C$\underline{H}$—CH—CH—N), 7.19 (dtr, $^3$J=6.4 Hz and $^4$J=1.5 Hz, 2H, ArH), 7.00 (dd, $^3$J=6.3 Hz and $^4$J=2 Hz, 2H; ArH), 6.28 (d, $^4$J=2 Hz, 2H; CH—C(C)—Ir), 5.23 (s, 1H; CH—C=O), 1.79 (s, 6H; CH$_3$). $^{13}$C{$^1$H} NMR (500 MHz, CDCl$_3$): $^{13}$C{$^1$H} NMR (500 MHz, CDCl$_3$): δ=184.8 (CO), 167.5 (CN), 148.2 (CH—N), 143.8 (C—Ir), 137.3, 135.4 (ArC), 125.1, 124.1, 121.9, 118.7 (Ar—CH), 100.5 ($\underline{C}$H—CO), 28.6 ($\underline{C}$H$_3$—CO). Exact Mass (IE): 755.9593 (calcd. 755.9599 for [M]$^+$ with ($^{193}$Ir)($^{79}$Br)); m/z: 658.8 (s, [M-acac]$^+$), 579.0 (m, [M-acac-Br]$^+$, 499 (w, [M-acac-(Br)$_2$]$^+$. C$_{27}$H$_{21}$Br$_2$IrN$_2$O$_2$.H$_2$O: calcd. C, 41.82; H, 2.99; N, 3.61. found C, 42.02; H, 2.60; N, 3.54.

Synthesis of [Ir(2-(6-p-pyridyl-phenyl)-9,9-dihexylfluorene)$_2$μ-Cl]$_2$

Synthetic route is analogous to synthesis of [Ir(2(4-bromophenyl)pyridine)$_2$μ-Cl]$_2$. Yield: 66%. $^1$H NMR (250 MHz, CDCl$_3$): δ=9.45 (d, $^3$J=5.4 Hz, 4H; CH—N), 7.95 (d, $^3$J=7.2 Hz, 4H), C$\underline{H}$—C—C(CH)—N), 7.80 (t, $^3$J=7.2 Hz, 4H; C$\underline{H}$—CH—C—C(CH)—N), 7.63 (br, 4H; C$\underline{H}$—CH—CH—N), 7.56 (mp, $^3$J=6.7 Hz, 4H; CH—C—N), 7.26 (br mp, 20H; ArH), 7.12 (s, 4H; FlH), 7.10 (mp, 4H, FlH), 6.89 (t, $^3$J=5.4 Hz, 4H; C$\underline{H}$—CH—N), 6.35 (s, 4H; CH—CIr), 1.7-2.0 (br mp, 16H; CH$_2$—C), 0.9-1.2 (br mp, 48H, CH$_2$), 0.78 (br mp, 24H; CH$_3$), 0.4-0.6 (br, 16H; CH$_2$).

Synthesis of N (Ir(2-(6-p-pyridyl-phenyl)-9,9-dihexylfluorene)$_2$(acac))

Synthetic route is analogous to synthesis of M. Yield: 78%. $^1$H NMR (250 MHz, CDCl$_3$): δ=8.63 (d, $^3$J=5.7 Hz, 2H; CH—N), 7.92 (d, $^3$J=7.9 Hz, 2H; CH—C≡C—N), 7.76 (tr, $^3$J=7.2 Hz and $^4$J=1.4 Hz, 2H; ArH), 7.64 (d, $^3$J=6.0 Hz, 2H; ArH), 7.58 (d, $^3$J=5.9 Hz, 2H; ArH), 7.2-7.3 (br mp, $^3$J=8.0 Hz, 12H; ArH), 7.1-7.2 (mp, $^3$J=7.1 Hz, 4H; ArH), 6.59 (s, 2H, CH—CIr), 1.8-2.0 (br, 8H; CH$_2$—C), 0.9-1.2 (br mp, 24H, CH$_2$), 0.77 (mp, 12H; CH$_3$), 0.4-0.6 (br, 8H; CH$_2$). $^{13}$C{$^1$H} NMR (500 Mz, CDCl$_3$): δ=184.7 (CO), 168.5 (CN), 150.8, 150.6 (C—C—CH$_2$), 148.4 (CH—N), 144.0 (C—Ir), 141.4, 140.9, 140.4, 139.9 (ArC), 136.7 (C$\underline{H}$—CH—CH—N), 126.7, 126.6, 125.8, 124.0, 122.7, 121.4, 121.3, 121.1, 120.0, 119.5, 119.3, 118.4 (CH), 100.4 (C$\underline{H}$—CO), 54.9 ($\underline{C}$—CH$_2$), 40.53, 40.48 (C—$\underline{C}$H$_2$), 31.5, 29.8 (CH$_2$), 28.8 ($\underline{C}$H$_3$—CO), 23.6 (C—CH$_2$—$\underline{C}$H$_2$), 22.6 (CH$_3$—$\underline{C}$H$_2$), 14.0, 13.9 (CH$_3$). Mass (EI) m/z: 1178.3 (w, [M-(C$_6$H$_{13}$)]$^+$), 1165.2 (s, [M-(acac)]$^+$, 1009 (m, [M-(C$_6$H$_{13}$)$_3$]$^+$). C$_{77}$H$_{87}$IrN$_2$O$_2$.H$_2$O: calcd. C, 72.10; H, 6.99; N, 2.18. found C, 72.40; H, 6.87; N, 2.27.

Synthesis of O (Ir(2-(6-p-pyridyl-phenyl)-7-(9,9-dihexylfluorenyl)-9,9-dioctylfluorene)$_2$(acac))

Synthetic route is analogous to synthesis of N with some minor alterations. The dichlorobridged diiridiumcomplex was prepared in 2-ethoxyethanol and precipitated by adding water. Yield: 59%. $^1$H NMR (400 MHz, CDCl$_3$): δ=8.65 (d, $^3$J=5.1 Hz, 2H; CH—N), 7.86 (d, $^3$J=7.8 Hz, 2H; C$\underline{H}$—C—C—N), 7.75-7.58 (mp, 24H; ArH), 7.37-7.16 (mp, 10H; ArH), 6.61 (s, 2H; C$\underline{H}$—CH—N), 5.27 (s, 1H; CH—CO), 2.03-1.94 (mp, 16H; C—C$\underline{H_2}$), 1.85 (s, 6H, CH$_3$—CO), 1.32-0.91 (mp, 64H, CH$_2$), 0.88-0.70 (mp, 40H, C$\underline{H_2}$—C$\underline{H_3}$). $^{13}$C{$^1$H} NMR (500 MHz, CDCl$_3$): δ=184.7 (CO), 168.5 (CN), 151.6, 151.4, 151.00, 150.97 ($\underline{C}$—C—CH$_2$), 148.4 (CH—N), 144.1 (C—Ir), 141.5, 140.8, 140.5, 140.2, 139.6 (ArC), 136.7 ($\underline{C}$H—CH—CH—N), 126.9, 126.7, 126.0, 125.9, 124.0, 122.9, 121.5, 121.34, 121.29, 119.8, 119.7, 119.4, 118.4 (CH), 100.8 ($\underline{C}$H—CO), 55.1, 55.0 ($\underline{C}$—CH$_2$), 40.6, 40.5, 40.3 (C—$\underline{C}$H$_2$), 31.78, 31.77, 31.4, 30.2, 29.7, 29.3, 29.2 (CH$_2$), 28.8 ($\underline{C}$H$_3$—$\underline{C}$H$_2$), 23.7 (C—CH$_2$—$\underline{C}$H$_2$), 22.58, 22.57, 22.54 (CH$_3$—$\underline{C}$H$_2$), 14.06, 13.99 (CH$_3$). Mass (IE) m/z: 2041.4 (s, [M]$^+$), 1942.4

(m, [M-acac)]⁺ $C_{135}H_{167}IrN_2O_2$: calcd. C, 79.40; H, 8.24; N, 1.37. found C, 79.12; H, 8.13; N, 1.17.

Synthesis of P (Ir(2-(6-p-pyridyl-phenyl)-7-(2-(7-[2-(9,9-dihexylfluorenyl)]))-9,9-dioctylfluorenyl)-9,9-dioctylfluorene)$_2$(acac))

Synthetic route is analogous to synthesis of N. Yield: 57%. $^1$H NMR (400 MHz, CDCl$_3$): δ=8.65 (d, $^3$J=5.4 Hz, 2H; CH—N), 7.94 (d, $^3$J=8.3 Hz, 2H; CH—C≡C—N), 7.82-7.78 (mp, 8H; ArH), 7.75-7.72 (t, $^3$J=8.2 Hz, 4H; ArH), 7.67-7.63 (mp, 22H; ArH), 7.38-7.31 (mp, 8H; ArH), 7.21-7.17 (mp, 4H; ArH), 6.61 (s, 2H; CH—CH—N), 5.28 (s, 1H; CH—CO), 2.11-2.02 (mp, 24H; C—CH$_2$), 1.85 (s, 6H, CH$_3$—CO), 1.20-1.07 (mp, 104H, CH$_2$), 0.82-0.67 (mp, 60H, CH$_2$—CH$_3$). $^{13}$C{$^1$H} NMR (500 MHz, CDCl$_3$): δ=184.7 (CO), 166.4 (CN), 151.7, 151.6, 151.4, 151.0 (C—C—CH$_2$), (CH—N not resolved), 143.3 (C—Ir), 140.7, 140.4, 140.3, 139.9 (ArC), (CH—CH—CH—N not resolved), 126.9, 126.7, 126.1, 126.0, 125.9, 122.8, 121.4, 119.9, 119.8, 119.7 (CH), 100.8 (CH—CO), 55.3, 55.12, 55.06 (C—CH$_2$), 40.5, 40.3 (C—CH$_2$), 31.7, 31.4, 30.1, 30.0, 29.6, 29.2, 29.1 (CH$_2$), 28.7 (CH$_3$—CO), 23.9, 23.7 (C—CH$_2$—CH$_2$), 22.53, 22.51 (CH$_3$—CH$_2$), 14.0, 13.9 (CH$_3$). Mass (IE) m/z: 2819 (m, [M]⁺), 2719 (w, [M-acac)]⁺). $C_{193}H_{247}IrN_2O_2$: calcd. C, 82.22; H, 8.83; N, 0.88. found C, 81.93; H, 8.77; N, 1.10.

Synthesis of ppy-pf8-ppy Q

Poly-Suzuki Reaction of 9,9-di-n-octylfluorene Containing 2-(6-p-pyridyl-phenyl) Endgroups on Both Sides To a solution of 500 mg (0.78 mmol) of 2,7-di(4,4,5,5,-tetramethyl-1,3,2,-dioxaboronate)-9,9-dioctylfluorene, 405.5 mg (0.740 mmol) of 2,7-dibromo-9,9-dioctylfluorene and 17.1 mg (0.078 mmol) 2-(6-p-pyridyl-phenyl in 3 ml toluene was added: 4 mg (0.004 mmol) Pd(PPh$_3$)$_4$ and 2.5 ml of (3.1 mmol) Et$_4$NOH. The resulting mixture was stirred for 24 h at 100° C. After 3 h, 5 ml toluene was added to dissolve the precipitated oligomers or to rise the viscosity of the mixture. After the mixture was cooled down to 20° C. the mixture was slowly transferred in a large excess of MeOH, allowing the polymer to precipitate as a white (slightly greenish) fibre-like solid. The solids were collected on a filter, redissolved in 50 ml of toluene and subsequently filtered on a short column of silica. The filtrate was transferred into MeOH resulting in a reprecipitation of the polymer as off-white fibres. The solvents were removed under reduced pressure. $^1$H NMR (250 MHz, CDCl$_3$): δ=8.72 (br d, 2H*12%; CH—N), 8.13 (br d, 2H*12%, CH—CH—CH—N), 7.9-7.5 (br, 6H, ArH), 2.3-2.0 (br, 4H, CH$_2$—C, 1.3-1.0 (br, 20H, CH$_2$), 0.9-0.7 (br, 10H, CH$_3$+CH$_2$). Mw (NMR): 10.000 (24-mer) GPC: Mp 48586, Mn 18618, Mw 67120, polydispersity 3.6.

Synthesis of ppy-pf8 E Suzuki Polymerisation of 9,9-di-n-octylfluorene Containing 2-(6-p-pyridyl-phenyl) Endgroup on One Side To a solution of 500 mg (0.56 mmol) of 2-(4,4,5,5,-tetramethyl-1,3,2,-dioxaboronate)-7-bromo-9,9-dioctylfluorene and 13.1 mg (0.056 mmol) 2-(6-p-pyridyl-phenyl in 5 ml toluene was added: 4 mg (0.004 mmol) Pd(PPh$_3$)$_4$ and 2.5 ml (3.1 mmol) of a Et$_4$NOH solution in water. The resulting mixture was stirred for 24 h at 110° C. After the mixture was cooled down to 20° C. the mixture was slowly transferred in a large excess of MeOH, allowing the polymer to precipitate as a yellow-white solid. The solids were collected on a filter, redissolved in 50 ml of toluene and subsequently filtered on a short column of silica. The filtrate was transferred into MeOH resulting in a reprecipitation of the polymer as off-white fibres. The solvents were removed under reduced pressure. $^1$H NMR (250 Mz, CDCl$_3$): δ=8.75 (br d, 2H*12%; CH—N), 8.13 (br d, 2H*12%, CH—CH—CH—N), 7.9-7.5 (br, 6H, ArH), 2.3-2.0 (br, 4H, CH$_2$—C, 1.3-1.0 (br, 20H, CH$_2$), 0.9-0.7 (br, 10H, CH$_3$+CH$_2$). Mw (NMR): 5000 (12-mer).

Synthesis of R$_1$

[Ir(acac)(Ppy-pf8-ppy)$_2$Ir(acac)]$_n$ Via the Iridium Complexation of Q

A mixture of 200 mg Q (containing 0.159 mmol 2-(6-p-pyridyl-phenyl) and 12.5 mg IrCl$_3$ (containing 0.0353 mmol of iridium) was transferred in a solvent mixture of 5 ml of toluene and 3 ml of 2-ethoxyethanol. The resulting clear brownish mixture was heated to 100° C. for 24 h and an orange gel was obtained which further precipitated in a large excess of MeOH. The product was collected on a glass fritted filter, washed with H$_2$O, MeOH and acetone, and finally the solvents were removed under reduced pressure. Subsequently, a suspension of 161 mg of this product, with 20 mg (0.2 mmol) acetylacetone and 20 mg (0.19 mmol) of Na$_2$CO$_3$ in 5 mL of 2-ethoxyethanol and 10 mL of toluene was heated at 90° C. for 24 h. After the reaction mixture was cooled down to room temperature the polymer was precipitated in a large excess of MeOH, collected on a filter and washed with H$_2$O, MeOH and acetone. The polymer was redissolved in 30-mL toluene upon heating at 90° C. for 4 h. The resulting mixture was first filtered over glasswool and then over a short silica column after which the polymer was reprecipitated using MeOH. The resulting polymer shows remarkable low solubility in most common solvents; it was found soluble in toluene, dichloromethane and benzene only after lengthy solication. Yield: 161 mg. $^1$H NMR (400 MHz, CDCl$_3$): δ=7.9-7.5 (br, 6H, ArH), 2.3-2.0 (br, 4H, CH$_2$—C), 1.3-1.0 (br, 20H, CH$_2$), 0.9-0.7 (br, 10H, CH$_3$+CH$_2$) (signals of iridium complex not resolved). Microanalysis: C, 84.58; H, 10.18; N, 0.42, Ir (AES) 0.65.

Synthesis of R$_2$

[Ir(acac)(ppy-pf8-ppy)$_2$Ir(acac)]$_n$ Via a Poly-Suzuki Reaction of 2,7-di(4,4,5,5,-tetramethyl-1,3,2,-dioxaboronate)-9,9-di-n-octylfluorene, 2,7-dibromo-9,9-dioctylfluorene and N (Ir(2(4-bromophenyl)pyridine)$_2$acac)

A solution of 500 mg (0.779 mmol) 2,7-di(4,4,5,5,-tetramethyl-1,3,2,-dioxaboronate)-9,9-dioctylfluorene, 405.5 mg (0.740 mmol) of 2,7-dibromo-9,9-dioctylfluorene, 29.5 mg (0.0389 mmol) of M (Ir(2(4-bromophenyl)pyridine)$_2$acac) and 4 mg (0.004 mmol) of (Pd(PPh$_3$)$_4$) in 10 mL of toluene was heated to 90° C. and 2.5 mL (3.1 mmol) of a Et$_4$NOH solution in water was added. The resulting two-phase mixture was stirred for 18 h at 100° C. and formed a brown-orange gel. The gel was precipitated in MeOH and washed with MeOH. The polymer was redissolved in 30 mL of dichloromethane and the resulting mixture was filtered using glass wool and subsequently filtered over a short silica column. The resulting polymer is soluble in toluene and dichloromethane after lengthy sonication, and gives high viscosity. $^1$H NMR (400 MHz, C$_6$D$_6$): δ=8.2-7.6 (br, 6H, ArH), 2.6-1.9 (br, 4H, CH$_2$—C), 1.6-0.7 (br, 30H, CH$_2$+CH$_3$) (spectrum is very broad, signals of iridium complex not resolved). GPC: Mp 50643, Mn 28146, Mw 62638, polydispersity 2.2. Microanalysis: C, 84.28; H, 9.71; N, 0.37, Ir (AES) 2.56.

Synthesis of $S_1$

[Ir(ppy-pf8)$_2$(acac)] Via Iridium Complexation of E

A mixture of 150 mg E (containing 0.0367 mmol 2-(6-p-pyridyl-phenyl)) and 5.2 mg IrCl$_3$ (containing 0.0147 mmol of iridium) was transferred in a solvent mixture of 10 ml of toluene and 10 ml of 2-ethoxyethanol. The resulting clear yellow-orange mixture was heated to 110° C. for 24 h after which the product was precipitated in a large excess of MeOH. The product was collected on a glass fritted filter, washed with MeOH and hexane, and finally the solvents were removed under reduced pressure. Subsequently, a clear solution the product and 20 mg (0.2 mmol) acetylacetone and 20 mg (0.19 mmol) of Na$_2$CO$_3$ in 8 mL of 2-ethoxyethanol and 2 mL of toluene was heated at 110° C. for 2 h. Upon cooling to 0° C. a yellow-orange precipitate was formed that was collected on a glass frittet filter, washed with H$_2$O and MeOH and the solvents were removed under reduced pressure. The product was filtered over a short silica column using toluene as the solvent. Yield: 100 mg. $^1$H NMR (250 MHz, CDCl$_3$): δ=8.65 (br, 1H*1%; CH—N), 7.9-7.5 (br, 6H, ArH), 6.62 (br, 1H*1%, C$\underline{H}$—CHN), 5.30 (br, 0.5H*1%; CH—CO), 2.3-2.0 (br, 4H, C$\underline{H}_2$—C), 1.82 (br, 3H*1%, CH$_3$—CO), 1.3-1.0 (br, 20H, CH$_2$), 0.9-0.7 (br, 10H, CH$_3$+CH$_2$). Microanalysis: C, 83.09; H, 9.61; N, 0.39.

Synthesis of $S_2$

[Ir(ppy-pf8)$_2$(acac)] Via a Poly-Suzuki Reaction Using C$_2$-(4,4,5,5 tetramethyl-1,3,2-dioxaborolane)-7-bromo-9,9-dioctylfluorene and M (Ir(2(4-bromophenyl)pyridine)$_2$acac)

A solution of 415 mg (0.697 mmol) of C, 26.4 mg (0.0349 mmol) of N, 2 mg (0.008 mmol) of Pd(acetate) and 4 mg (0.016 mmol) of PCy$_3$ was heated to 90° C. and 2.5 mL (3.1 mmol) of a Et$_4$NOH solution in water was added. The resulting mixture was stirred at 110° C. for 20 h, resulting in a slightly viscous clear red solution. The organic layer was dropped out in a large excess of MeOH, which resulted in the precipitation of an orange polymer. This was washed with water, MeOH and acetone and filtered over a short silica column using toluene as the eluent. The resulting solution was concentrated to 2 ml and 100 mg of Na$_2$CO$_3$, 1 mL of acacH and 8 mL of 2-ethoxyethanol were added. The reaction mixture was stirred for 2 h at 110° C. and subsequently cooled down to room temperature. 2 mL of MeOH was added on which the product precipitated as an orange solid. The product was isolated on a glass fritted filter, washed with H$_2$O and MeOH and the solvents were removed under reduced pressure. Yield: 150 mg (55%). δ=8.7 (d, J=4.6 Hz, 1H*10%; CH—N), 7.9-7.5 (br, 6H; ArH), 7.4-7.1 (br, ArH), 6.6 (s, 1H*10%; C$\underline{H}$—CH—N), 5.3 (s, 0.5H*10%; CH—CO), 2.3-2.0 (br, 4H, C$\underline{H}_2$—C), 1.9 (3H*10%; CH$_3$—CO), 1.3-1.0 (br, 20H, CH$_2$), 0.9-0.7 (br, 10H, CH$_3$+CH$_2$). Microanalysis: C, 82.78; H, 9.44; N, 0.25.

S$_3$ was synthesised analogues to S$_2$ but using a solution of 415 mg (0.697 mmol) of C and 13.2 mg (0.0349 mmol) of N. Yield: 230 mg (85%). δ=8.7 (d, J=5.0 Hz, 1H*3%; CH—N), 7.9-7.5 (br, 6H; ArH), 7.4-7.1 (br, ArH), 6.6 (s, 1H*3%; C$\underline{H}$—CH—N), 5.3 (s, 0.5H*3%; CH—CO), 2.3-2.0 (br, 4H, CH$_2$—C), 1.9 (3H*3%; CH$_3$—CO), 1.3-1.0 (br, 20H, CH$_2$), 0.9-0.7 (br, 10H, CH$_3$+CH$_2$). Microanalysis: C, 87.10; H, 10.02; N, 0.20.

LED Fabrication and Measurements

The electroluminescent devices have been fabricated as described below. An indium-tin oxide (ITO) patterned and cleaned glass substrate was obtained from Cambridge Display Technology Limited. A hole-injection layer, Poly(3,4-ethylene-dioxythiophene):poly(styrene sulfonic acid) (PEDOT:PSS, obtained from Bayrton as an aqueous solution and used without further pretreatment), was spin-coated (2000 rpm, 30 seconds) onto the ITO. The PEDOT:PSS layer was dried on a hotplate (130 C) for 5 minutes. Next, a hole-transport layer of polyvinylcarbazole PVK) was spin-coated, from a 3 mg/nL solution in dichloromethane, on top of the PEDOT:PSS layer. Subsequently, the light-emitting polymer was spin-coated (from a 10-15 mg/mL solution in toluene) on top of this layer. Then, the device was transferred to a high-vacuum (1×10$^{-5}$ mbar) deposit unit and set with a shadow mask A cathode metal, calcium, was deposited on the organic layers through the shadow mask, followed by deposition of aluminium. The size of each pixel is 4 mm×3.2 mm. The device was finally encapsulated using Araldite epoxy resin and covered with a glass slide. Typical characteristics of the device layers include: ITO (190 nm, sheet resistance<10Ω/☐)/PEDOT:PSS (50 nm)/PVK (45 nm)/light-emitting polymer (70 nm)/Ca (40 nm)/Al (200 nm). The devices were examined by applying a direct current bias (0 to 25 V) to the electrodes. The electroluminescent characteristics were measured with a Hewlett-Packard E3631A DC Power Supply, Keithley 2000 Digital Multimeter, Topcon BM-9M Luminance Meter, and Aminco-Bowman Series 2 Fluorescence Spectrometer.

Results and Discussion

Synthesis of Iridium(Ppy)-Fluorenyl Hybrid Systems

The 4-position of 2-phenylpyridine (ppy) was functionalised with a series of 9,9-dialkylfluorene segments including one, two and three subsequent fluorenyl substituents (Scheme 1).

Scheme 1

Synthetic Pathway to 9,9-dialkylfluorene Substituted 2-phenylpyrine Ligands (2(4-bromophenyl)pyrine) (A) was synthesised via a coupling of pyridine to parabromoaniline using the Gomberg-Hey reaction.[5] Monofluorenyl functionalised ppy was obtained by a Suzuki coupling of A with 2-(4,4,5,5 tetramethyl-1,3,2-dioxaborolane)-9,9-dihexylfluorene to obtain (2-(6-p-pyridyl-phenyl)-9,9-dihexylfluorene) (D). The key building block of our stepwise synthesis; 2-(4,4,5,5 tetramethyl-1,3,2-dioxaborolane)-7-trimethylsilyl-9,9-dioctylfluorene (B) was synthesised in two steps from 2,7-dibromo-9,9-dioctylfluorene via a monolithiation using nBuLi, quenched with TMSCl followed by a second lithiation using tBuLi, that was further reacted with 2-isopropoxy-4,4,5,5 tetramethyl-1, 3,2-dioxaborolane to obtain B. 4-Difluorenyl functionalised ppy was obtained in two steps from the Suzuki product of A and B via the deprotection of the TMS group using ICl (which yields 2-(6-p-pyridyl-phenyl)-7-tetramethyl-1,3,2-dioxaborolane)-9,9-dihexylfluorene to obtain 2-(6-p-pyridyl-phenyl)-7-(9,9-dihexylfluorenyl)-9,9-dioctylfluorene (H).[6] 4 Trifluorenyl functionalised ppy was obtained from the Suzuki product of G and 2-(4,4,5,5 tetramethyl-1,3,2-dioxaborolane)-9,9-dihexylfluorene via the same deprotection/Suzuki reaction sequence to obtain 2-(6-p-pyridyl-phenyl)-7-(2-(7-[2-(9,9-dihexylfluorenyl)]))-9,9-dioctylfluorenyl)-9,9-dioctylfluorene (K).

Scheme 2

Synthesis of 4-fluorenyl Functionalised ppy Ligands

Oligofluorene-bis-ppy was synthesised using a Pd(PPh$_3$)$_4$ catalysed poly-Suzuki reaction using A, 2,7-di(4,4,5,5,-tetramethyl-1,3,2,-dioxaboronate)-9,9-dioctylfluorene and 2,7-dibromo-9,9-dioctylfluorene as the building blocks to yield ppy-pf8-ppy (O) (Scheme 2).[7] Oligofluorene-mono-ppy was obtained from the same coupling reaction using A and 2-(4,4,5,5 tetramethyl-1,3,2-dioxaborolane)-7-bromo-9,9-dioctylfluorene (C) as the building blocks to obtain ppy-pf8 (E) (Scheme 2).

Bis-cyclometalated iridium complexes of the type Ir(ppy-X)$_2$(acac) were synthesised according to a two-step synthetic route that was recently reported by Lamansky et al.[8] In the first step, IrCl$_3$.nH$_2$O is reacted with an excess of the ppy containing ligand to yield the chloro-bridged dimer [Ir(ppy-X)$_2$(-μ-Cl)]2 (Scheme 3)

Scheme 3

Synthesis Pathway to Bis-CN-Cyclometalated Iridium Complexes

The chloro-bridges iridium dimers are subsequently converted to phosphorescent monomeric acetylacetonate complexes. (Ir(2(4-bromophenyl)pyridine)$_2$acac) (M), (Ir(2-(6-p-pyridyl-phenyl)-9,9-dihexylfluorene)$_2$(acac)) (N), (Ir(2-(6-p-pyridyl-phenyl)-7-(9,9-dihexylfluorenyl)-9,9-dioctylfluorene)$_2$(acac)) (O) and Ir(2-(6-p-pyridyl-phenyl)-7-(2-(7-[2-(9,9-dihexylfluorenyl)]))-9,9-dioctylfluorenyl)-9,9-dioctylfluorene)$_2$(acac)) (P) were all synthesised accordingly (Scheme 3).

The synthesis of iridium(ppy)-oligofluorenyl systems was attempted via two approaches (Scheme 4).

Scheme 4

Synthetic Pathways Towards Ir(ppy)-Oligofluorenyl Systems

Analogous to the model compounds, both Q and E were exposed to the two-step synthetic pathway via the chlorobridged iridium dimer towards the acetylacetonate containing monomer. This seemed troublesome using Q, since a full conversion to the chloro-bridged idirium dimer was filtrated by gellation of the reaction mixture. AES analyses on the targeted product; [Ir(acac)(ppy-pf8-ppy)$_2$]$_n$(R$_1$) revealed that the iridium content was only 0.65% (objected: 4%). Moreover, the resulting polymer did only dissolve after extensive sonication. Upon complexation of E the gel-formation was completely avoided due to the prevention of network formation of the dichloro-bridged intermediate. Hence, the product of this two-step reaction sequence; [Ir(ppy-pf8)$_2$(acac)] (S$_1$) is readily soluble in dichloromethane and toluene. From NMR it was concluded that 1% Ir(ppy)$_2$(acac) segments are present (while 4% was objected).

Alternatively, complex M was applied in a poly-Suzuki reaction using 2,7-di(4,4,5,5,-tetramethyl-1,3,2,-dioxaboronate)-9,9-dioctylfluorene and 2,7-dibromo-9,9-dioctylfluorene as the building blocks to yield [Ir(acac)(ppy-pf8-ppy)$_2$]$_n$ (R$_2$). Also via this pathway the synthesis of R gave rise to gelformation during the reaction and caused solubility problems in the manufactoring of it. This method did however give rise to an increased inbuild of Ir(ppy)(acac) segments compared to approach R$_1$; in this case the iridium contents was 2.6%. The most successful iridium(ppy)-oligofluorenyl system was obtained via a poly-Suzuki reaction using C and M. The resulting product [Ir(ppy-pf8)$_2$(acac)] (S$_2$) was highly soluble in dichloromethane and toluene and contained 5% of the bis-cyclometalated iridium complex. A subsequent reaction with acacH was needed to restore the acac-anion back on the complex.

Photophysical Properties of Ir(ppy-X)$_2$(acac) Complexes

Figure 1:
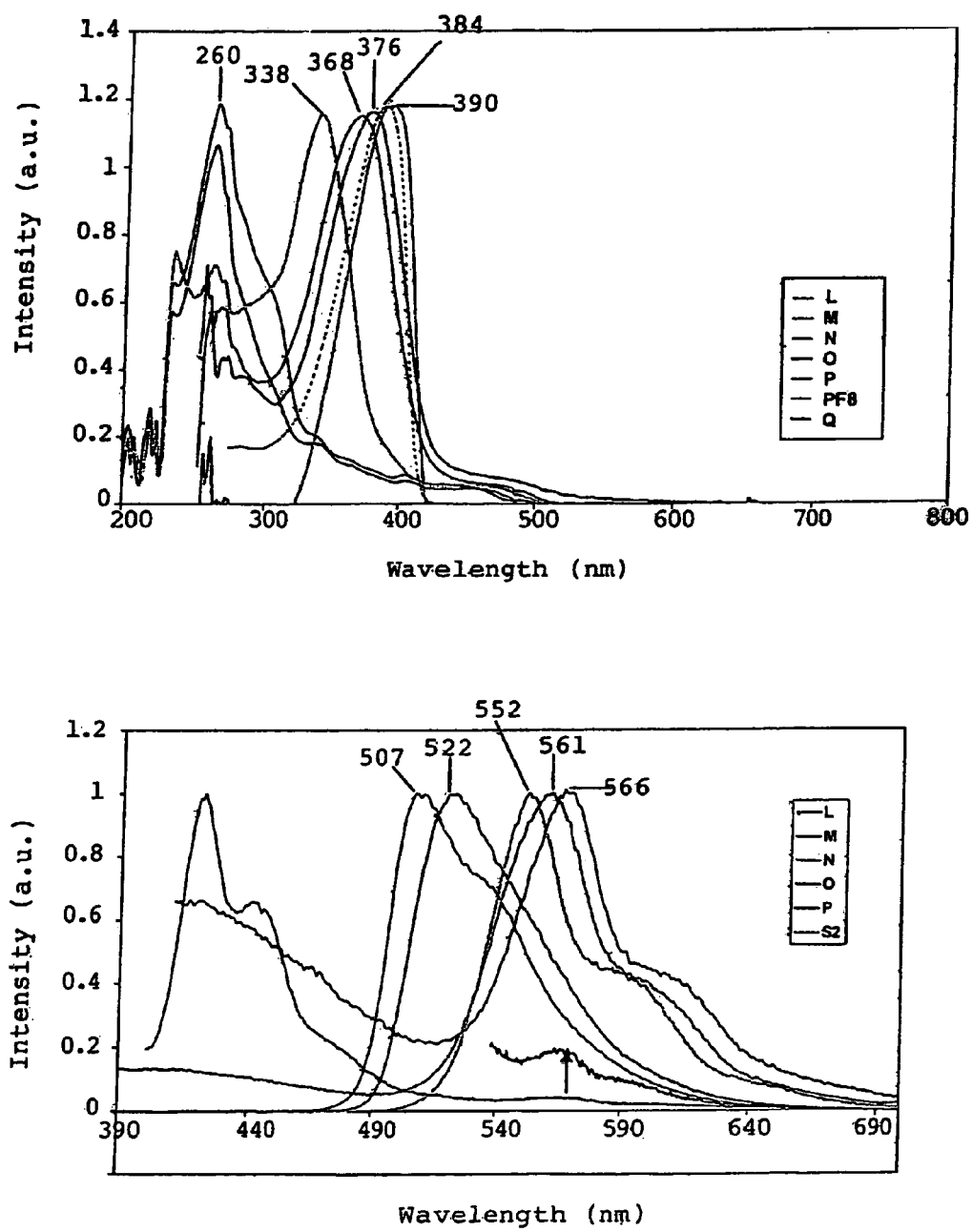
FIG. 1 shows absorption and PL-spectra of Ir(ppy-X)$_2$(acac) complexes.

Absorption and photoluminescence (PL) spectra were recorded of the series of cyclometalated iridium complexes to investigate the influence of the fluorenyl-substitution on the 4-position of the ppy (FIG. 1).

FIG. 1: Absorption and PL-Spectra of Ir(ppy-X)$_2$(acac) Complexes

The parent compound L shows an absorption band and 260 nm while it emits at 507 nm. When a monofluorenyl-segment is placed at the 4 position of the ppy (complex N), the absorption maximum was observed at 338 nm with a second, minor maximum at 260 nm. Clearly, complex N absorbs both from the n system as well as from the d-orbitals of the iridium complex. Further extension of the system of the ligands with subsequent fluorenyl units (via complexes O and P) resulted in a red shift of the absorption maximum from the n system of the ligand accompanied by a relative decrease of the absorption intensity originating from the transition metal. Complex P shows a maximum absorption at 376 nm which is only 8 nm lower than where polyfluorene absorbs. For this complex, the absorption from the transition metal is only observed as a minor absorption peak at 260 nm. In comparison; when the 4-position of the ppy was substituted by a bromine, it had no impact on the absorption spectrum at all.

Interestingly, compared to the unsubstituted complex, the PL-spectrum of complex N (one fluorenyl) is red shifted with respect to L by 30 nm, to 552 nm. From this it can be concluded that the triplet wavefunction in this system is not confined to the Ir(ppy) unit but extended over the complete system. A second fluorenyl-segment (complex O) gave rise to a further red shift of 9 nm (to 561 nm) and a third (P) provided a PL-maximum of 566 nm.

In general it appears that the influence of the repeat units of the fluorenyl-chain on the wavefunction is gradually decreasing when positioned further away from the phosphor, but that at least the first three fluorenyl units influence the triplet wavefunction (in our case by causing a total red shift of 44 nm).

EL-characteristics were investigated by manufactoring OLED's (organic light emitting diode) from these model compounds. The OLED device consists of a basic three layered structure sandwiched between indium tinoxide and a calcium electrode; ITO/PEDOT-PSS/PVK/Emitting layer/Ca/Al. The use of PEDOT-PSS is commonly known as a hole-injection layer, the polyvinylcarbazole layer (PVK) is added as a hole transport layer and was found to generally smoothen the device characteristics. The series of L, N, O and P were spincoated in this structure from a toluene solution. The EL-spectra of these devices roughly show the same trend as the PL-spectra. In this series, the emission maximum shifts red from 529 nm for L, via 561 nm (N), to 567 nm for O and P. Apart from a little red-shift all of the EL-spectra of these compounds closely resemble their PL-spectra Not a trace of fluorenyl originating singlet emission from these systems was observed.

Figure 2:
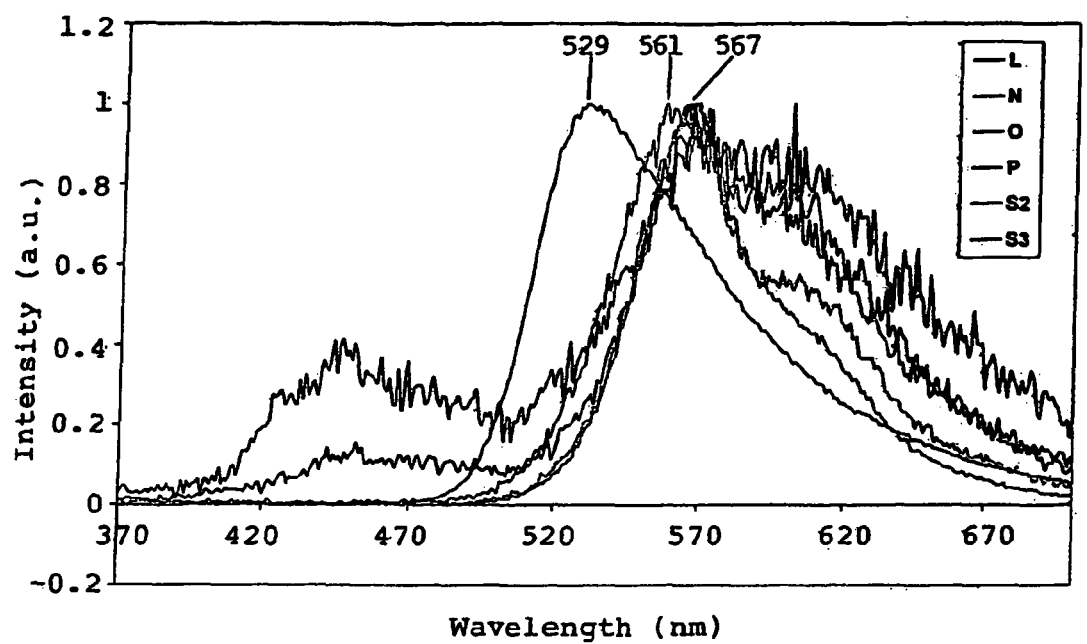
FIG. 2 shows EL-spectra of Ir(ppy-X)$_2$(acac)

FIG. 2: EL Spectra of Ir(ppy-X)$_2$(acac) (Inset Shows the Device Structure)

TABLE 1

EL-characteristics of Ir(ppy-X)$_2$(acac)

| System | Lum. max (cd/m$^2$) | turn on voltage (V) | CIE X | CIE Y | Efficiency (cd/A) | ELQY (%) | Colour |
|---|---|---|---|---|---|---|---|
| L | 60 | 4.0 | 0.37 | 0.59 | 2.5 * 10$^{-3}$ | 7.4 * 10$^{-4}$ | yellowish-green |
| N | 43 | 5.0 | 0.48 | 0.51 | 9.9 * 10$^{-3}$ | 3.3 * 10$^{-3}$ | greenish yellow |
| O | 400 | 5.5 | 0.48 | 0.51 | 6.9 * 10$^{-2}$ | 2.2 * 10$^{-2}$ | yellow |
| P | 1400 | 6.0 | 0.46 | 0.53 | 7.3 * 10$^{-2}$ | 7.3 * 10$^{-2}$ | greenish yellow |

Figure 3:
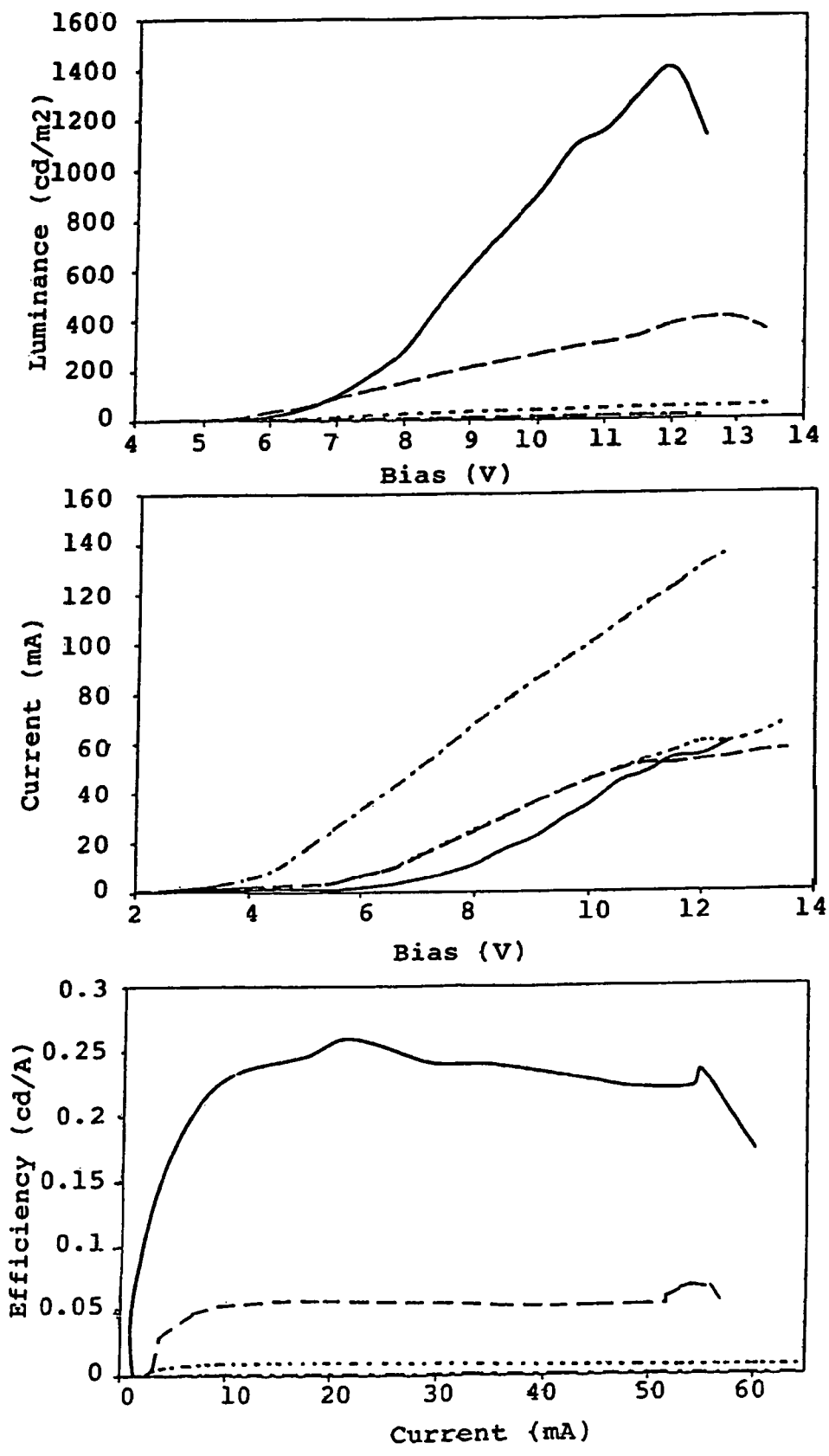
FIG. 3 shows I-L-V curves of Ir(ppy-X)$_2$(acac)

The device properties improve substantially on extending the ligand system with fluorenyl segments (Table 1 and FIG. 3). The maximum brightness increased from 60 (for L), via 43 for N, 400 for O to 1400 for P, while the quantum yield improved two orders of magnitude from 7.4*10$^{-4}$ to 7.3*10$^{-2}$.[9] The turn on voltage went up slightly upon increasing the percentage of fluorene.

From the experiments described above it was concluded that the covalent bonding of fluorenyl segments directly to the system of the ligand system of this type of phosphorescent complexes is beneficial for its ability to harvest triplets. This phenomenon is not explained solely by the improved film formatting capabilities of the higher fluorenyl substituted phosphors. We suggest that upon increasing the system of the phosphor, more uniform films are obtained with a more homogeneous distribution of the iridium(ppy) species, avoiding clustering which can give rise to triplet annihilation. The size of the system of the phosphors might also be of importance in the efficiency of capturing charges.

FIG. 3: I-L-V Curves of Ir(ppy-X)$_2$(acac)

Figure 4:
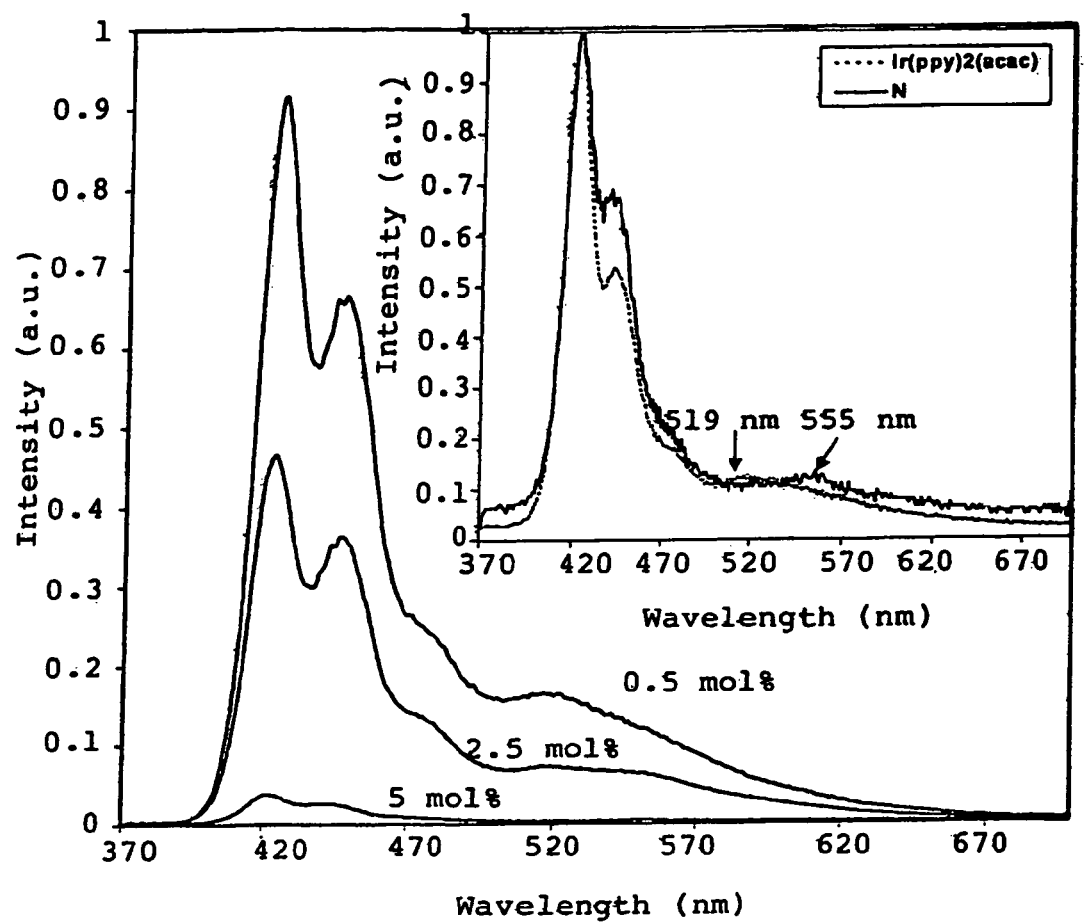
FIG. 4 shows PL-spectra of blends of complex N in PF8. Insert shows triplet signal of blends of 5.0 mol % of complex L and N in PF8.

The results prompted us to investigate this type of phosphors in a polyfluorene matrix. PL measurements of blends of complex L and N in a 9,9-dioctyl-polyfluorene (PF8) matrix revealed that singlet emission from the polyfluorene was significantly quenched by both phosphors, but that the triplet emission (at room temperature under aerobic conditions) from both systems was very low (FIG. 4). Exciton Foster transport from the S$_1$ of the polymer to the T$_1$ seems to be efficient, but a different mechanism (triplet annihilation, or Dexter transfer of triplets from the phosphor back to the polymer) seems responsible for a major quenching of excitons on the phosphor.

FIG. 4: PL Spectra of Blends of Complex N in PF8. Inset; Triplet Signal of Blends of 5.0 mol % of Complex L and N in PF8.

Figure 5:
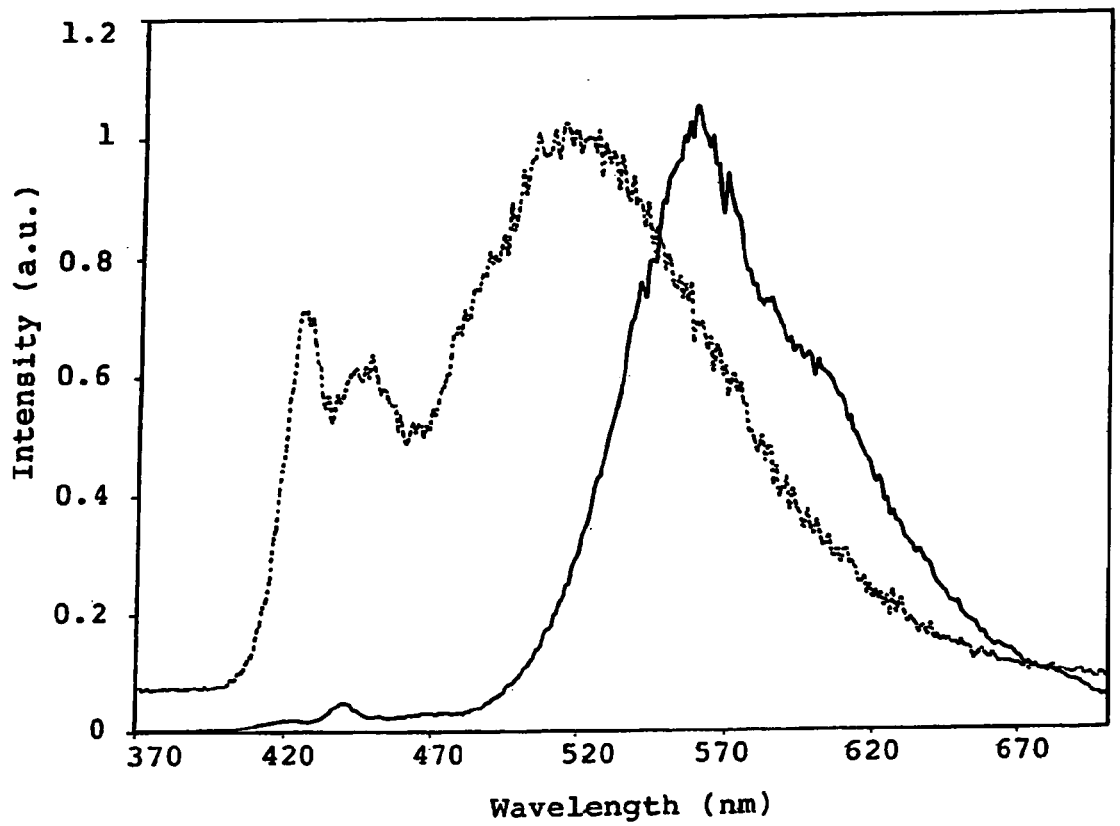
FIG. 5 shows EL-spectra of Ir(ppy-X)$_2$(acac) in polyfluorene.

The EL spectrum of L in PF8 showed a marked resemblance with that of undoped PF8, but the emission maximum was shifted from 516 to 533 (note that the emission maximum of 516 nm of PF8 is caused by excimer formation due to aggregation effects) (FIG. 5). It seems that this device emits both from the singlet excited state of the polymer (a maximum at 414 nm) as well as from the triplet excitons on the transition metal complex (533 nm). The blend of complex N in PF8 showed nearly only triplet emission. The emission maximum at 559 nm is clearly originating from the phosphor (552 nm was observed for the neat complex; FIG. 2) whereas the singlet peak at 443 nm is very small. We owe this difference between complex L and FIG. 5: EL Spectra of Ir(ppy-X)$_2$(acac) in Polyfluorene N to the difference in T$_1$-level. From the emission spectra it was estimated that the T$_1$-level of L is about 2.4 eV, and that of complex N is 2.2 eV. On comparing this with the T$_1$ level of PF8, which is recently calculated to be about 2.30 eV[10] it can be predicted that in the case of L part of the triplets, captured on the phosphor, will hop to the T$_1$-level (Dexter transfer) of the polymer and decay non-radiatively. Hence triplet emission is frustrated by this process. In the case of complex N such a process is less likely since the estimated T$_1$-level of the polymer is higher than that of the phosphor.

TABLE 2

EL-data on blends of Ir(ppy-X)$_2$(acac) in polyfluorene

| System | Lum. max (cd/m$^2$) | turn on voltage (V) | CIE X | CIE Y | Efficiency (cd/A) | ELQY (%) | Colour |
|---|---|---|---|---|---|---|---|
| L in PF8 | 225 | 5.5 | 0.35 | 0.48 | 0.16 | 7.6 * 10$^{-2}$ | yellowish-green |
| N in PF8 | 190 | 7.5 | 0.44 | 0.52 | 0.15 | 5.6 * 10$^{-2}$ | greenish yellow |

The enhanced triplet to singlet ratio of complex N in PF8, compared to the blend of L, doesn't give rise to a significant change in device efficiency (5.6*10$^{-2}$ vs 7.6*10$^{-2}$, Table 2).

Polyfluorenyl Functionalised Phosphors

The concept of fluorenyl substituted phosphors was taken one step further by implementing the bis-cyclometalated iridium phosphors in the main chain of polyfluorene. The PL-spectra of these hybrid systems (I, R$_2$, S$_1$, and S$_2$) are depicted in FIG. 6.

Figure 6:
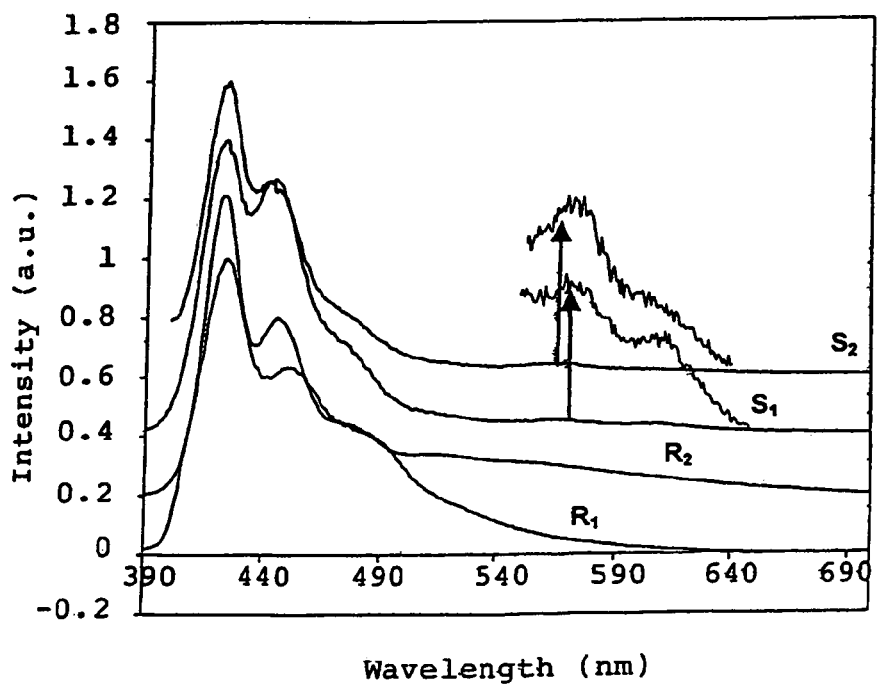
FIG. 6 shows PL-spectra of Ir(ppy-X)$_2$(acac) incorporated polyfluorenes.

FIG. 6: PL-Spectra of Ir(ppy-X)$_2$(acac) Incorporated Polyfluorenes

All systems show singlet emission (with maxima at 422 and 450 nm) originating from the polyfluorene part of the molecule. In R$_1$ and R$_2$ no triplet emission was observed. This, together with the NMR-spectra, strongly suggests that in these systems the Ir(ppy-X)$_2$(acac) phosphor could no be adequately implemented in the polymer chain due to gelation problems during the synthesis. In this respect systems S$_1$ and S$_2$ were more promising since in these materials, only one phosphor can be build in every molecule (Scheme 4) leading to better defied and applicable (soluble) systems. Both S$_1$ and S$_2$ showed triplet PL-emission at 596 nm.

The EL-spectra of the novel hybrid system, depicted in FIG. 7, again show the marked differences between the R and S products.

Figure 7:
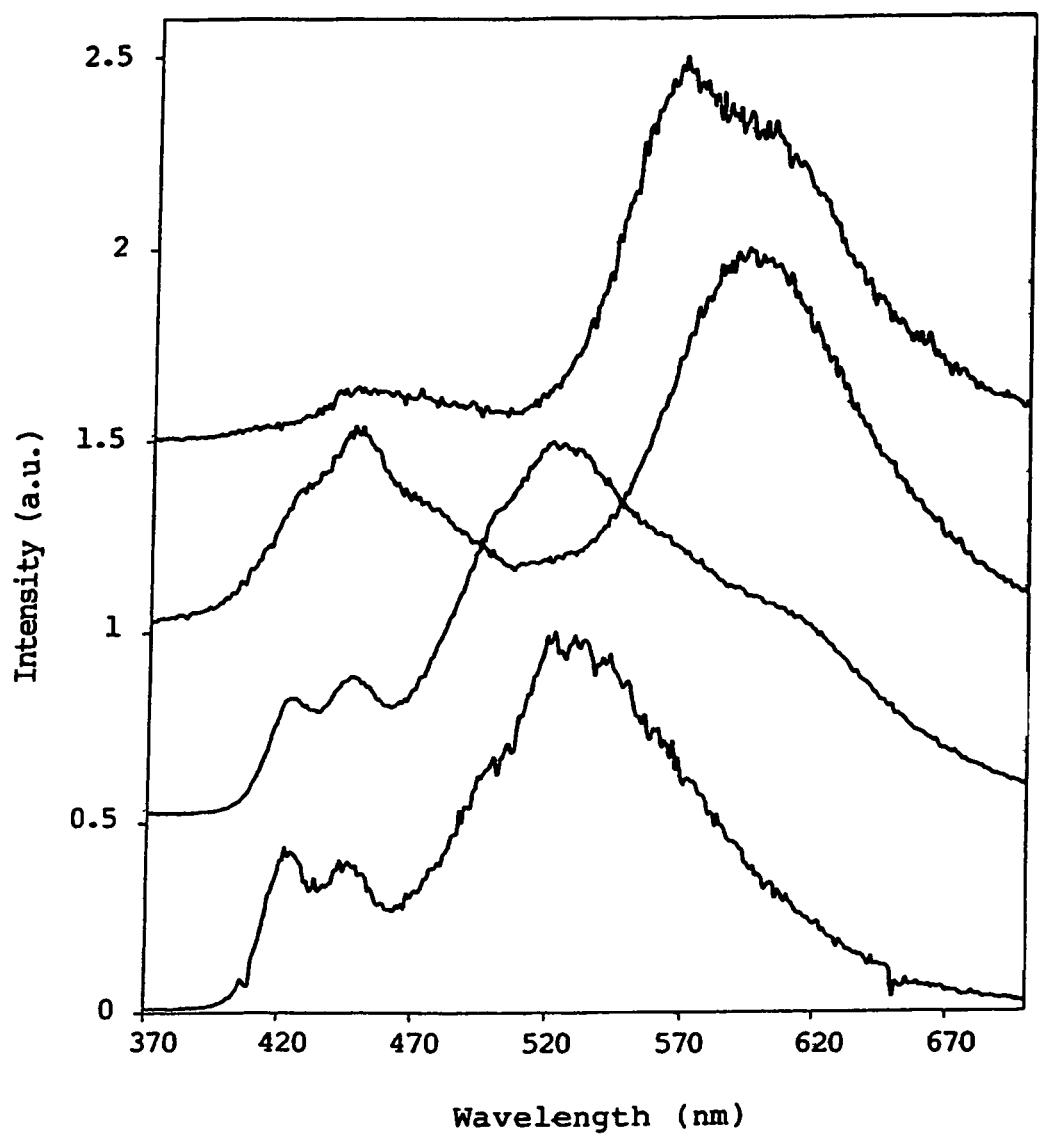
FIG. 7 shows EL-spectra of polyfluorene incorporated Iridium-complexes.

FIG. 7: EL-Spectra of Polyfluorene Incorporated Iridium-Complexes

The spectra of R$_1$ and R$_2$ are very broad and show a lot of singlet and singlet-excimer emission, caused by aggregation (the low solubility of these compounds gave rise to increased aggregation, compared to normal polyfluorene). R$_1$ doesn't show any triplet emission at all, while a shoulder at ~604 nm could indicate some triplet emission from the device fabricated from system R$_2$. The device, containing system S$_1$ was found to emit singlets and triplets in the ratio 1:3 and S$_2$ yielded a singlet to triplet ratio of 1:23. This resulted in pink emission (according to the CIE-coordinates X=0.42 and Y=0.34) for S$_1$ systems whitish orange emmission for S$_2$ (X=0.47 and Y=0.43) (Table 3).

Figure 8:
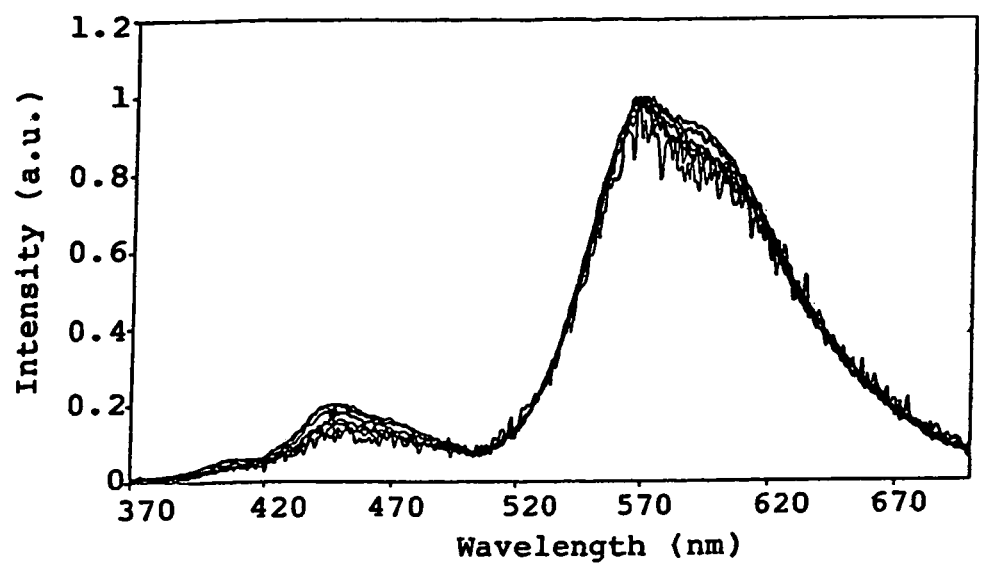
FIG. 8 shows EL-spectra of S$_2$ at increasing driving voltage, going from 8.5V (bottom) up in steps of 0.5V to 12.5V (top)
Figure 8:
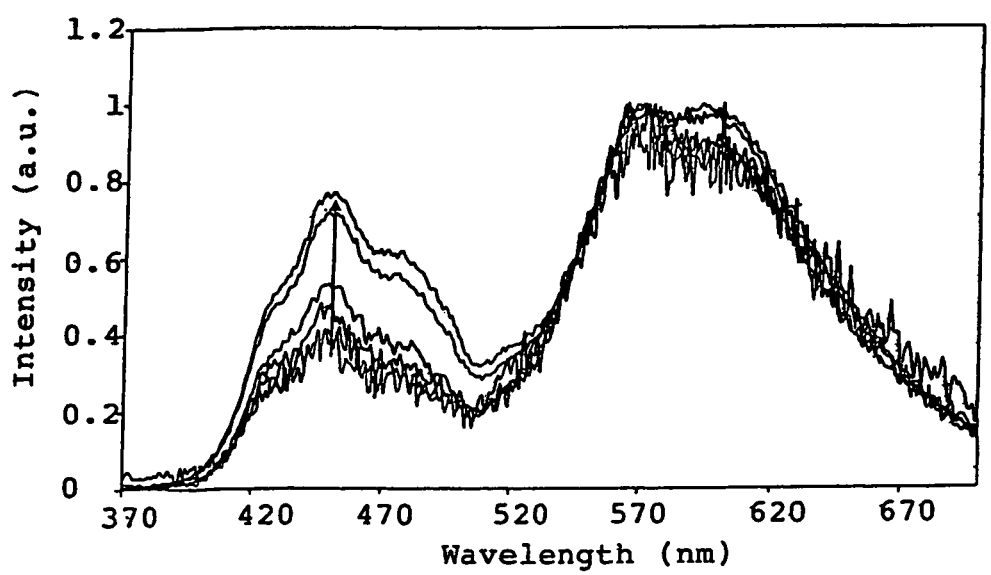
Figure 9:
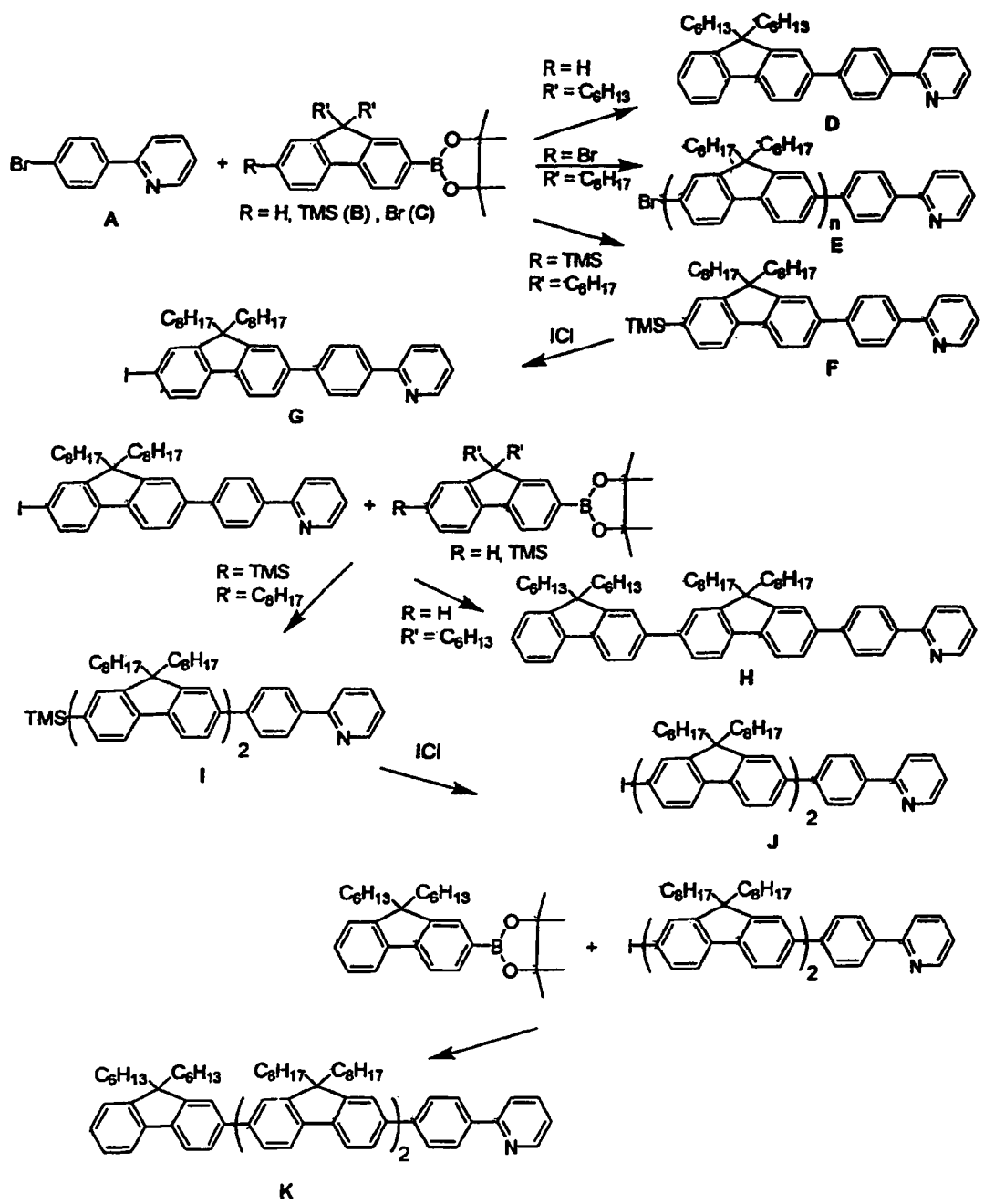
FIG. 9 shows scheme 1 as referred to below.
Figure 10:
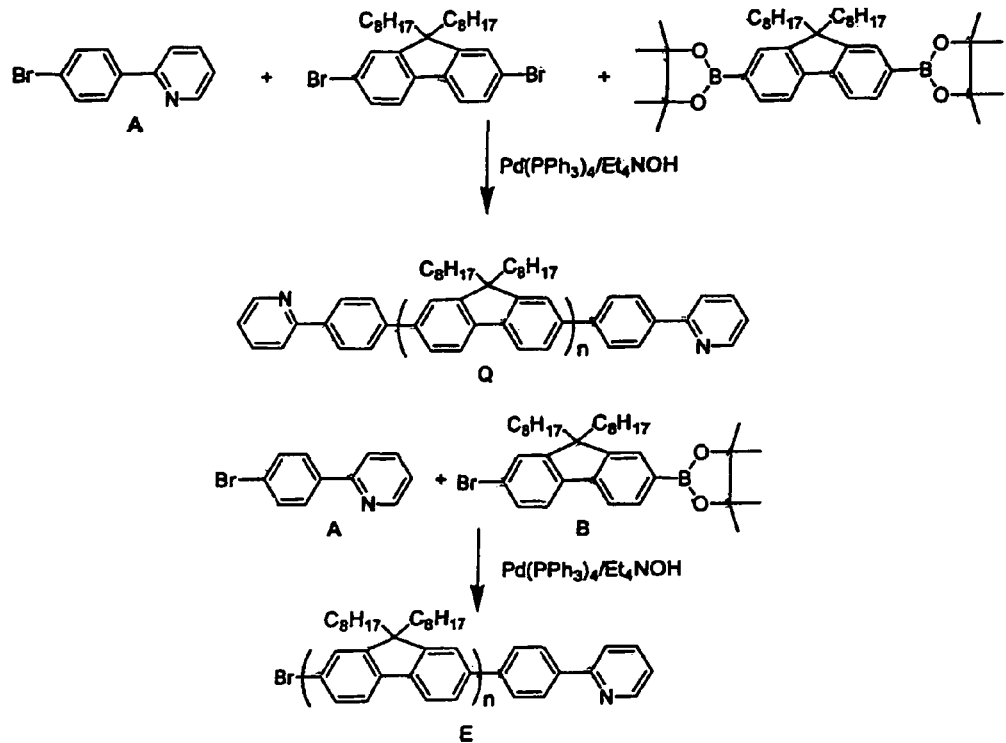
FIG. 10 shows scheme 10 as referred to below.
Figure 11:
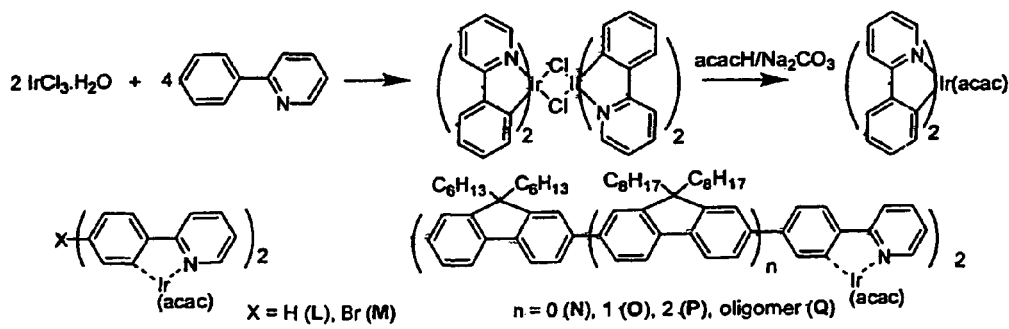
FIG. 11 shows scheme 3 as referred to below.
Figure 12:
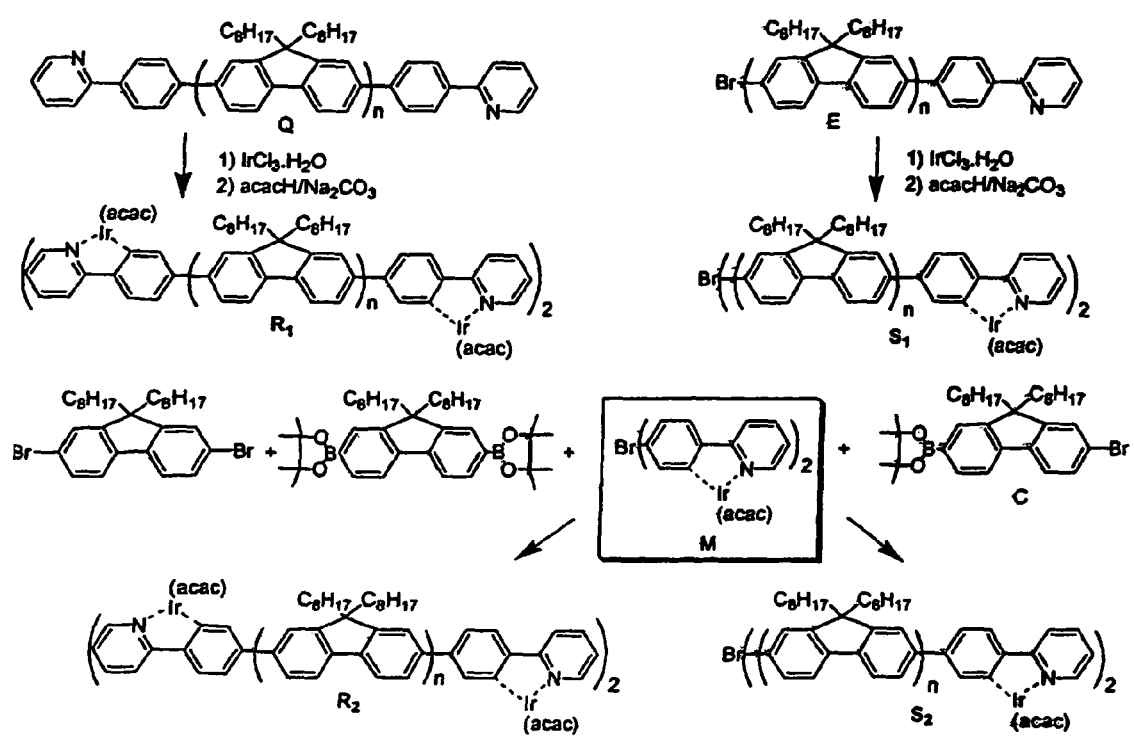
FIG. 12 shows scheme 4 as referred to below.

FIG. 8: EL-Spectra of $S_2$ at Increasing Driving Voltage, Going from 8.5V (Bottom) Up in Steps of 0.5V to 12.5V (Top).

The singlet to triplet ratio was found to increase upon increasing the driving voltage (FIG. 8). This is explained by an increase in triplet-triplet annihilation at higher driving voltages. The observed increase in excimer formation at increased driving voltages is a wellknown phenomenon in polymer LED's.

TABLE 3

EL-data on polyfluorenyl-iridium(ppy) complexes

| System | Lum. max (cd/m²) | turn on voltage (V) | CIE X | CIE Y | Efficiency (cd/A) | ELQY (%) | Colour |
|---|---|---|---|---|---|---|---|
| $R_1$ | 10 | 8.5 | 0.29 | 0.45 | $7.0 * 10^{-2}$ | $2.6 * 10^{-2}$ | yellowish-green |
| $R_2$ | 60 | 8.5 | 0.33 | 0.44 | 0.13 | $7.1 * 10^{-2}$ | yellowish-green |
| $S_1$ | 42 | 9.5 | 0.42 | 0.34 | $7.6 * 10^{-2}$ | $3.6 * 10^{-2}$ | pink |
| $S_2$ | 163 | 7.0 | 0.47 | 0.43 | 0.19 | $7.9 * 10^{-2}$ | whitish-orange |
| $S_3$ | 304 | 6.0 | 0.42 | 0.40 | 0.18 | $7.9 * 10^{-2}$ | whitish-orange |

The EL-device characteristics of the hybrid systems are summarized in Table 3. As observed from the EL-spectra the R samples give yellowish-green emission, originating from singlet- and singlet-excimer emission at low brightness (10 cd/m² for $R_1$ and 60 cd/m² for $R_2$) at a quantum yield of $2.6*10^{-2}$ and $7.1*10^{-2}$ respectively. The better defined S samples emit mainly from the triplet state and a little from the singlet excited state. $S_1$ gives pink emission (CIE-X 0.42, CIE-Y 0.34) with a maximum brightness of 42 cd/m² with a quantum yield of $3.6*10^{-2}$. $S_2$ and $S_3$ both yield whitish orange emission at a quantum yield of $7.9*10^{-2}$. The relative longer polyfluorene substituents of $S_3$ (30 fluorenyl units versus 10 for $S_2$) gives rise to an increase of the maximum brightness from 163 to 304 cd/m².

CONCLUSION

A series of polyfluorenyl-phosphor composite materials has been studied that give bright phosphorescence in solution-processed devices. The addition of fluorene substituents to the ligands of the small molecule Ir(ppy)$_2$(acac) yielded materials that are readily spin-coated from solution of blends in fluorene and, more importantly, also as neat materials. The fluorenyl substituents were found to give rise to a major improvement in EL-luminance brightness and in quantum efficiency. A beneficial effect of the substituents was observed in the improved complementation of the $T_1$-energy level of the phosphor to that of polyfluorene in blends. OLED's prepared from polyfluorenyl-phosphor composites were reported to yield bright triplet emitting devices.

The novel phosphors are hybrid compounds of a bis cyclometalated iridium-2-phenylpyridinato complex (Ir(ppy)$_2$) triplet emitter, and polyfluorene, an efficient singlet emitting polymer. The series consists of Ir(ppy)$_2$(acac) complexes having fluorenyl substituents on the 4-position of the ppy ligand. In the series, from non substituted complex Ir(ppy)$_2$ (acac) (L) via monofluorenyl substituted complex [Ir(2-(6-p-pyridyl-phenyl)-9,9-dihexylfluorene)$_2$(acac)] (N) and the difluorenyl Ir(2-(6-p-pyridyl-phenyl)-7-(9,9-dihexylfluorenyl)-9,9-dioctylfluorene)$_2$(acac)] (O) to the trifluorenyl [Ir(2-(6-p-pyridyl-phenyl)-7-(2-(7-[2-(9,9-dihexylfluorenyl)]))-9,9-dioctylfluorenyl)-9,9-dioctylfluorene)$_2$(acac)] (P) a major red-shift was observed in the PL-spectra of these complexes from 522 nm, via 552 nm and 561 to 566 nm. The polyfluorenyl substituted complex [Ir(ppy-pfB)$_2$(acac)] ($S_2$) also showed PL triplet emission at 566 nm, along with minor singlet emission at 445 nm. The red-shift of complex N with respect to L of 30 nm was found sufficient to complement the $T_1$ energy level of the phosphor to that of polyfluorene; the EL spectrum of a blend of N in this polymer shows mainly triplet emission at 559 nm while the blend, containing complex L ($\lambda_{max}$ at 535 nm), still shows substantial singlet emission at 441 nm. The stepwise elongation of the ppy ligand with fluorenyl segments resulted in a major increase in EL-brightness (from 60 for L to 1400 cd/m² for P) and in EL-quantum efficiency (from $7.4*10^{-4}$ to $7.3*10^{-2}$). Yellowish orange EL emission was obtained from $S_2$ (estimated fluorenyl length; 10 units) with a triplet to singlet ratio of 23:1 at a driving voltage of 7V, with a quantum efficiency of $7.9*10^{-2}$ and a maximum brightness of 163 cd/m². Upon increasing the length of the polyfluorene substituent to 30 ($S_3$) yielded whitish orange emission having a triplet to singlet ratio of 7:1 (at 6V), with a quantum efficiency of $7.9*10^{-2}$ and a maximum brightness of 304 cd/m².

Section 2: Pyridyl-Benzothiophene Ligands

The invention is exemplified in this section with reference to organometallic groups comprising phenylpyridine ligands L. In particular, J. Am. Chem. Soc., 2001, 123, 4304 discloses a red emitting organometallic group as shown below:

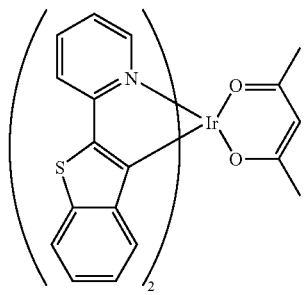

Synthesis of a ligand comprising a bromine in order to make a monomeric version of the above complex is shown below:

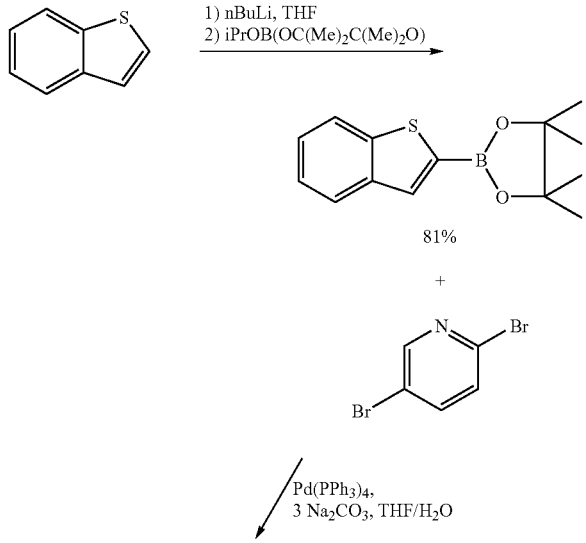

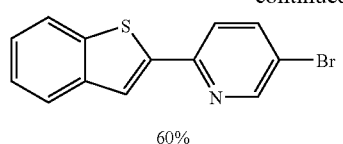

60%

The first step in the synthesis was lithiation of benzo(b) thiophene, which can be selectively carried out at the 2-position by use of nBuLi. The lithium adduct was then reacted in situ with 2-isopropoxy-4,4,5,5-tetramethyl-1,3,2-dioxaborolane and crude product purified by column chromatography (silica gel, 60% $CH_2Cl_2$ in Hexanes, Rf 0.5). The desired compound was isolated in 81% yield. The second step involved a Suzuki coupling and this was accomplished with good yield and with high selectivity by using a syringe pump to slowly add 2-(4',4',5',5'-Tetramethyl-1',3',2'-dioxaborolane)benzo(b)thiophene to 2,5-dibromopyridine. The crude product was purified by column chromatography (silica gel, 50% $CH_2Cl_2$ in Hexanes), enabling separation of benzo(b)thiophene ($R_f$ 0.68), product ($R_f$ 0.35) and 2,5-Bis(-(4',4',5',5'-tetramethyl-1',3',2'-dioxaborolane)benzo(b)thiophene ($R_f$ 0.22). The product fraction contained some unreacted 2,5-dibromopyridine that was removed by sublimation. After several sublimations pure product was obtained in 60% yield. The reaction is surprisingly selective, giving almost none of the 5-pyridyl coupled product and this could be due to coordination of the pyridyl nitrogen to the palladium catalyst thus activating the 2-bromo substituent for the oxidative addition reaction. The by-products of the reaction are obtained in low yield; benzo(b)thiophene could have been formed by a de-boronation of the starting material. This is a facile reaction, especially in water, and can be disfavoured by slow addition of the thiophene to an excess of bromopyridine. The other by-product was bis-2,5-benzo(b)thiophene)pyridine, which was isolated in low yield (<10%), again this product can be disfavoured by slow addition of the thiophene to an excess of bromopyridine. In conclusion, the reaction is remarkably selective and the yield good, another facet of the reaction is that it is tolerant to scale up, working well on scales ranging from 1-10 mmol. The new compound has been fully characterized, giving elemental analyses in good agreement with calculated values and showing a molecular ion peak in the EI mass spectrum with an isotope distribution consistent with calculations. En the $^1H$ NMR spectrum the peak at 8.68 ppm was assigned to the proton in between the N and Br on the pyridyl ring. It is at lowest field as it is the most deshielded proton. There are three other sets of peaks at higher field due to the other pyridyl and benzyl protons. The $^{13}C\{^1H\}$ NMR spectrum shows 13 peaks due to each of the carbons in the ligand.

The new ligand was reacted with Iridium(III) trichloride to give a chloride bridged dimer. The chloride bridges of the dimer were cleaved by reaction with 2,4-pentanedione to give the desired acetyl acetonate complex as shown below:

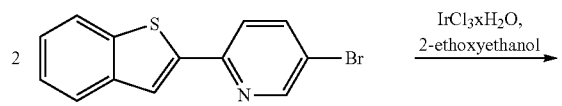

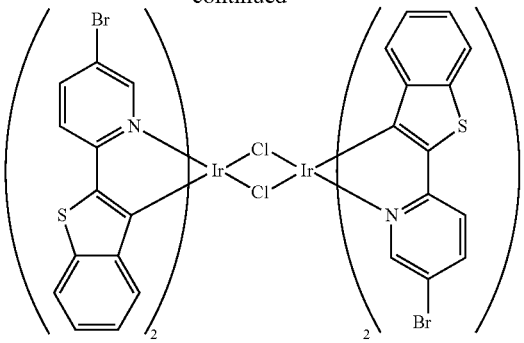

63%

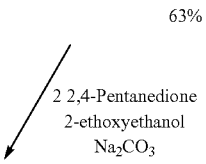

2 2,4-Pentanedione
2-ethoxyethanol
$Na_2CO_3$

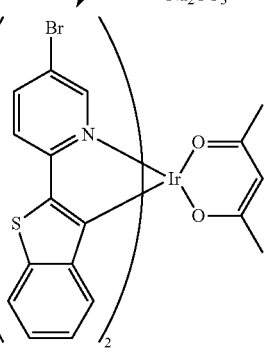

90%

Refluxing two equivalents of the ligand with Iridium(III) trichloride in 2-ethoxyethanol for 20 h, enabled isolation of the chloride bridged dimeric complex in 63% yield. The complex was highly insoluble, preventing NMR characterization, but was sufficiently soluble for mass spectrometry. MALDI showed a peak for the molecular ion and also one for the monomeric species, which probably formed under the conditions of the spectrometry due to cleavage of the chloride bridges. The chloride bridges can also be cleaved by reaction with 2,4-pentanedione or acac. The dimeric compound, acac and base were refluxed for 20 h in 2-ethoxyethanol, giving $L_2Ir(acac)$ in excellent yield as red crystals. The complex was much more soluble than the dimers and dissolved in chloroform, methylene chloride and toluene. $^1H$ NMR spectroscopy showed very distinctive peaks for the aromatic protons; each showing a separate signal with well resolved couplings at higher field than the free ligand. This is as expected for metal chelation which would be anticipated to dishield the aromatic protons. The C,N chelation is also confirmed by the absence of proton signals for the thiophene carbon coordinated to the metal and by the doublet in the $^{13}C\{^1H\}$ NMR for the carbon coordinated to and coupling with Iridium. Singlets are observed in the $^1H$ NMR at 5.33 and 1.84 ppm due to the methylene and methyl protons of the acac ligand. Elemental analysis is in good agreement with the calculated values and mass spectrometry is awaited. Layering a $CH_2Cl_2$ solution of the complex with Hexanes and allowing the solvents to slowly mix grew crystals suitable for X-ray analysis. A ball and stick model of the X-ray crystal structure is shown in FIG. 13 and selected bond lengths (in angstroms) and angles are given in the table below.

| | | | |
|---|---|---|---|
| Ir(1)—C(7) | 2.00(2) | C(20)—Ir(1)—N(2) | 78.9(8) |
| Ir(1)—C(20) | 2.02(2) | C(20)—Ir(1)—O(2) | 89.4(7) |
| Ir(1)—N(1) | 2.067(18) | N(1)—Ir(1)—O(2) | 92.6(6) |
| Ir(1)—N(2) | 2.074(17) | N(2)—Ir(1)—O(2) | 85.0(6) |
| Ir(1)—O(1) | 2.139(15) | C(7)—Ir(1)—O(1) | 90.0(7) |
| Ir(1)—O(2) | 2.133(14) | N(1)—Ir(1)—O(1) | 89.0(6) |
| C(7)—Ir(I)—C(20) | 92.1(8) | N(2)—Ir(1)—O(1) | 90.7(6) |
| C(7)—Ir(1)—N(1) | 80.5(8) | O(2)—Ir(1)—O(1) | 89.5(5) |

The complex crystallises in the P2(1)/n space group where z=8. The other symmetry related molecule in the unit cell has been omitted for clarity. The complex has slightly distorted octahedral symmetry with the largest bond angle between the two carbon atoms (92.1(8)°) and the smallest between the C and N on the same ligand (78.9(8)°). The ligands are bound such that the two N atoms are oriented trans to one another and the C atoms are cis. The bond lengths are within the range expected for such Ir(III) complexes [J. Am. Chem. Soc., 2001, 123, 4304, Can. J. Chem., 1998, 76, 1571, J. Phys. Chem. B, 2000, 104, 9118]

The monomer 2-Bromo-7-(4',4',5',5'-Tetramethyl-1',3',2'-dioxaborolane)-9,9-dioctylfluorene was synthesised as shown below using standard procedures (e.g. ee Can. J. Chem., 1998, 76, 1571).

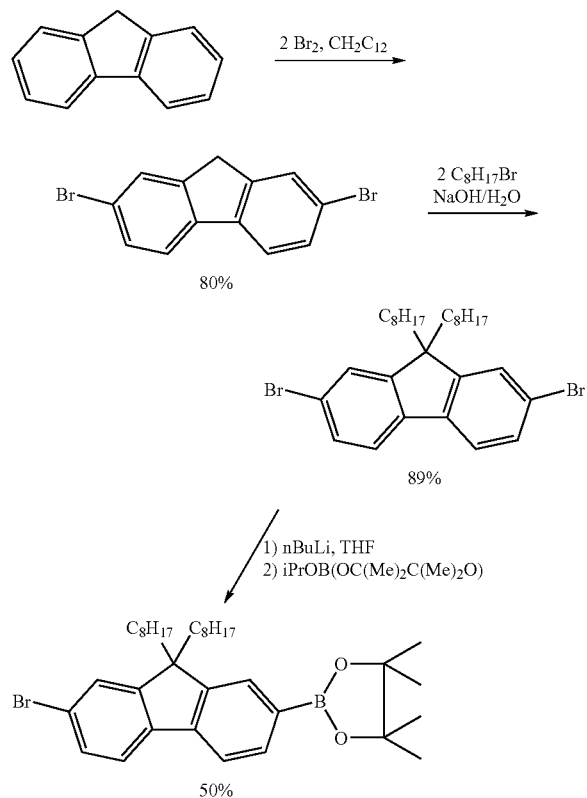

The new polymers/oligomers were synthesised via a Suzuki coupling reaction between fluorene monomers and the chains were extended by reaction with the Iridium complex, as shown below:

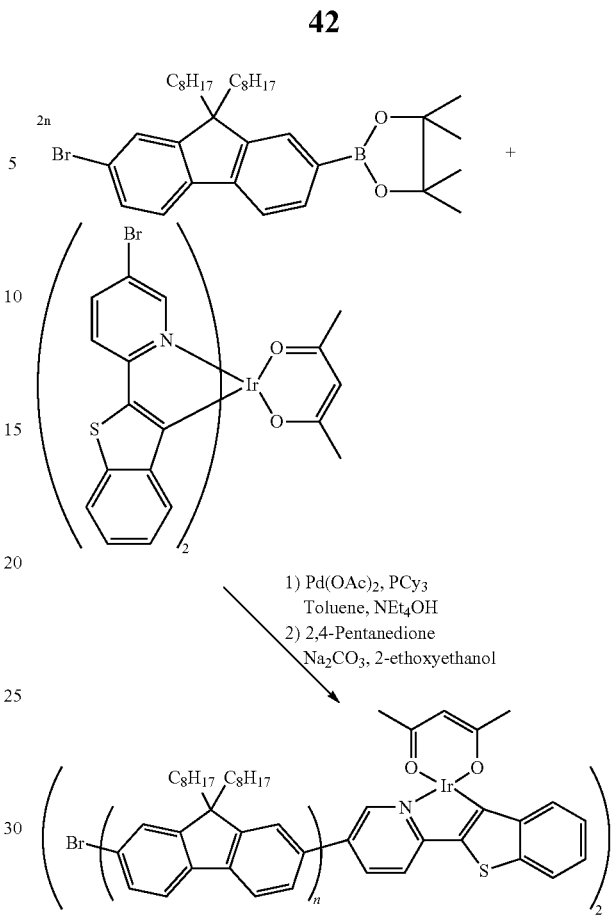

The polymerisation/oligomerisation reaction involved coupling of fluorene monomers with each other and with the Iridium complex. The reaction was catalysed by $Pd(OAc)_2$ with $PCy_3$ ligands and $NEt_4OH$ as the base. The polymer/oligomer was reacted with excess acac to ensure complete complexation and purified by precipitation from methanol. It was washed thoroughly to remove any unreacted monomer and palladium residues were removed by filtering the solution through silica. Solvent residues were removed from the polymer/oligomer by freeze-drying from a benzene solution. Several polymerisation/oligomerisation reactions have been carried out using different ratios of fluorene monomer to Iridium and therefore with chain lengths, n, ranging from 5-20 units.

The PL spectra of thin films of the polymers/oligomers spin-coated onto glass slides are shown in FIG. 14.

Various characterisation techniques were used for the polymers/oligomers and these gave slightly different values for the number of repeat units in the polyfluorene chain. $^1$H NMR showed broadened peaks for the polyfluorene chains at 7.90-7.55 ppm for the aromatic protons and at 2.30-2.00, 1.20-1.00 ppm and 0.90-0.70 ppm for the alkyl chains. Broadened peaks due to the 2-(benzo(b)thiophenyl)pyridyl ligands at 8.86, 8.48, 6.86 and 6.44 ppm were used, along with peaks due to acac at 5.40 and 1.85 ppm, to calculate the chain length (n). They give values in good agreement with the reaction stoichiometries. It should be noted that no peaks are observed for the starting Iridium complex, suggesting complete incorporation into the polymer. $^{13}C\{^1H\}$ NMR showed signals for the carbon atoms in the polyfluorene chains.

The polymers/oligomers were used as the emitting layer in single layer devices. The LEDs were fabricated by spin coating a PEDOT/PSS layer onto an ITO coated slide. The polymer/oligomer was then spin coated and finally a layer of calcium and aluminium were vacuum deposited onto the top of the device. The devices gave bright red emission from around 6 V. The electroluminescence spectra are shown in FIG. 15.

The polymers/oligomers show electroluminescence spectra, which are different to the photoluminescence, in this case being dominated by triplet emission from the iridium complex at around 650 nm. There is a little emission in both cases at around 420 nm, which is where polyfluorene would be expected to emit. In addition to the syntheses described above, it will be appreciated that such red emitting organometallic groups may be incorporated into a polymer in the same way as described in section 1 for polymers/oligomers according to the invention wherein the organometallic complex comprises a phenylpyridine ligand described in Section 1.

[1] J. Chem. Soc. 1964, 2175.
[1] Inorg. Chem. 1984, 23, 4249.
[1] Sprouse et. al. J. Am. Chem. Soc. 1984, 106, 6647.
[1] M. E. Thomson et. al. J. Am. Chem. Soc. 2001, 123, 4304.
[1] Abramovitch, R. A.; Saha, J. G. J. Chem. Soc. 1964, 2175.
[1] a) Henze, O.; Lehmann, U.; Schluter, A. D. Synthesis-Stuttgart 1999, 4, 683. b) Hensel, V.; Schlüter, A. D. Chem. Eur. J. 1999, 5, 421.
[1] a) The Dow Chemical Company (Inbasekaran, M.; Wu, W.; Woo, E. P.) U.S. Pat. No. 5,777,070 (1997). b) Cambridge Display Technology Limited (Towns, C.; O'Dell, R A) WO 00/53656 (2000).
[1] Lamansky, S.; Djurovich, P.; Murphy, D.; Abdel-Razzaq, F.; Kwong, R; Tsyba, I.; Bortz, M.; Mui, B.; Mui, B.; Bau, R.; Thompson, M. E. J. Inorg. Chem. 2001,40, 1704.
[1] We are aware that much higher efficiencies can be obtained for these type of complexes when doped in a small molecule matrix as was found by Lamansky et al.
[1] Monkinan, A. P.; Burrows, H. D.; Hartwell, L. J.; Horsbutgh, L. E.; Hamblett, I.; Navaratnam, S. Phys. Rev. Lett 2001, 86, 1358.

The invention claimed is:

1. A process for preparing a material capable of luminescence, wherein the luminescence predominantly is phosphorescence, said material comprising a polymer or oligomer and an organometallic group, the organometallic group being covalently bound to the polymer or oligomer only at end-capping positions of the polymer or oligomer, wherein the organometallic group is present in the material in an amount between 1 weight percent and 10 weight percent; said process comprising:
    (a) reacting monomers to form a polymer or oligomer wherein each monomer has at least two reactive groups selected from the group consisting of a halide group, a boronic acid group, a boronic ester group, and a borane group, and each monomer comprises an aryl or heteroaryl group; and
    (b) terminating the polymer or oligomer formed in step (a) using an end-capping reagent, said end-capping reagent comprising one reactive group selected from the group consisting of a halide group, a boronic acid group, a boronic ester group, and a borane group, said end-capping reagent further containing the organometallic group.

2. A process according to claim 1, wherein the polymer or oligomer is at least partially conjugated.

3. A process according to claim 1, wherein the polymer or oligomer is linear.

4. A process according to claim 1, wherein the luminescence is electroluminescence.

5. A process according to claim 1, wherein the polymer or oligomer is semiconducting.

6. A process according to claim 5, wherein the aryl or heteroaryl group comprises a group selected from the group consisting of 2,7-linked 9,9 disubstituted fluorenes, p-linked dialkyl phenylenes, p-linked disubstituted phenylenes, phenylene vinylenes, 2,5-linked benzothiadiazoles, 2,5-linked substituted benzothiadiazoles, 2,5-linked disubstituted benzothiadiazoles, 2,5-linked substituted thiophenes, unsubstituted thiophenes, and triarylamines.

7. A process according to claim 1, wherein the organometallic group contained in the end-capping reagent contains a transition metal.

8. A process according to claim 7, wherein the organometallic group contained in the end-capping reagent contains a precious metal.

* * * * *